(12) United States Patent
Kondo et al.

(10) Patent No.: US 10,637,481 B2
(45) Date of Patent: Apr. 28, 2020

(54) OSCILLATOR AND ELECTRONIC DEVICE

(71) Applicant: SEIKO EPSON CORPORATION, Tokyo (JP)

(72) Inventors: Manabu Kondo, Matsumoto (JP); Kensaku Isohata, Minowa-machi (JP); Kenji Hayashi, Chino (JP)

(73) Assignee: SEIKO EPSON CORPORATION, Tokyo (JP)

(*) Notice: Subject to any disclaimer, the term of this patent is extended or adjusted under 35 U.S.C. 154(b) by 25 days.

(21) Appl. No.: 16/000,012

(22) Filed: Jun. 5, 2018

(65) Prior Publication Data

US 2019/0006988 A1 Jan. 3, 2019

(30) Foreign Application Priority Data

Jun. 29, 2017 (JP) .................. 2017-127046

(51) Int. Cl.
H03L 1/04 (2006.01)
H03B 5/32 (2006.01)
H03H 9/08 (2006.01)
H03L 1/02 (2006.01)
H03H 9/10 (2006.01)
H03H 9/02 (2006.01)
H03H 9/05 (2006.01)

(52) U.S. Cl.
CPC .............. H03L 1/04 (2013.01); H03B 5/32 (2013.01); H03H 9/02102 (2013.01); H03H 9/0547 (2013.01); H03H 9/08 (2013.01); H03H 9/1014 (2013.01); H03L 1/023 (2013.01); H03L 1/028 (2013.01)

(58) Field of Classification Search
CPC .. H03L 1/04; H03L 1/028; H03B 1/02; H03B 5/04; H03B 5/32; H03B 5/36; H03H 9/08; H03H 9/1014; H03H 9/02102; H03H 9/0547; H05K 1/0212; H05K 2201/10068; H05K 2201/062; H05K 3/306; H05K 2201/09036; H05K 2201/10075; H05K 2201/10545; H05K 2201/10946; H05K 3/301; H05K 3/305
See application file for complete search history.

(56) References Cited

U.S. PATENT DOCUMENTS

| 7,514,852 | B2* | 4/2009 | Kasahara | ............. H03H 9/0514 310/340 |
| 8,026,460 | B2* | 9/2011 | Ito | ........................ H03L 1/028 219/210 |
| 9,236,868 | B2* | 1/2016 | Isohata | ..................... H03L 1/04 |
| 2014/0320221 | A1 | 10/2014 | Kondo | |

FOREIGN PATENT DOCUMENTS

JP 2014-216809 A 11/2014

* cited by examiner

Primary Examiner — Ryan Johnson
(74) Attorney, Agent, or Firm — Oliff PLC

(57) ABSTRACT

An oscillator includes a case that has a base and a cap connected to the base; a first substrate accommodated in the case; a lead terminal electrically connected to the first substrate; and a resonator module electrically connected to the lead terminal and supported by the lead terminal with a gap with respect to the first substrate between the first substrate and the base.

11 Claims, 13 Drawing Sheets

OSCILLATOR AND ELECTRONIC DEVICE

BACKGROUND

1. Technical Field

The present invention relates to an oscillator and an electronic device.

2. Related Art

In the related art, an oscillator that reduces damage due to shock, or the like applied to a mounted circuit board, heats a resonator element, a container, or the like to stabilize temperature of the resonator element, and stabilizes a resonance frequency is known as an electronic device. For example, JP-A-2014-216809 discloses an oscillator (electronic device) of a so-called double-decker structure that includes a board that is disposed in a case configured of a base and a cap attached to the base and is supported by a second support (lead terminal) attached to the base, a resonator device supported by a first support (lead terminal) attached to the board, and a heat generating element that is disposed in the vicinity of the first support.

However, in the oscillator (electronic device) of the so-called double-decker structure disclosed in JP-A-2014-216809, the resonator device is supported by the first support (lead terminal) attached to the board supported on the base by the second support (lead terminal). The oscillator needs a small size and a thin thickness. However, in a configuration in which two supports of the double-decker structure are used, for example, a lead terminal that forms each support cannot be lengthened. As a result, stiffness of the lead terminal becomes high, or absorption of shock or the like does not become sufficient. Thus, there may be a restriction in performance of a resonator device, or the oscillator may become large for enhancement of performance.

SUMMARY

An advantage of some aspects of the invention is to solve at least a part of the problems described above, and the invention can be implemented as the following forms or application examples.

Application Example 1

An oscillator according to this application example includes: a case that has a base and a cap connected to the base; a first substrate that is accommodated in the case; a lead terminal that is electrically connected to the first substrate; and a resonator module that is electrically connected to the lead terminal, and is supported by the lead terminal with a gap with respect to the first substrate between the first substrate and the base.

According to the oscillator of this application example, the resonator module is supported by the lead terminal connected to the first substrate accommodated in the case formed by the base and the cap, with a gap with respect to the first substrate between the first substrate and the base. In other words, the resonator module is supported in a suspended state between the first substrate and the base through the lead terminal. As described above, since the resonator module is supported in the suspended state between the base and the first substrate, for example, it is possible to easily absorb shock or the like by increasing the length of the lead terminal to weaken stiffness of the lead terminal. Since components are easily and tightly disposed in a space between the base and the first substrate compared with the case of a double-decker structure, it is possible to achieve miniaturization, and to obtain the freedom of design for enhancement of performance through to a room in the space between the base and the first substrate in a case where it has the same size as that of the double-decker structure.

Application Example 2

In the oscillator according to the application example, it is preferable that the base and the cap are air-tightly sealed.

According to this application example, since the base and the cap are air-tightly sealed, the inside of the accommodation space is not easily affected by the influence of an outside air temperature, and thus, it is possible to enhance accuracy of temperature control of the resonator module disposed in the accommodation space.

Application Example 3

In the oscillator according to the application example, it is preferable that the first substrate has a first surface disposed on the side of the base and a second surface opposite to the first surface and the lead terminal is connected to the first surface.

According to this application example, as the lead terminal is disposed between the first substrate and the base, the lead terminal is not easily affected by an outside air temperature through the cap or the base, and thus, it is possible to reduce the influence of heat applied to the resonator module from the lead terminal.

Application Example 4

In the oscillator according to the application example, it is preferable that the first substrate has a first surface disposed on the side of the base and a second surface opposite to the first surface and the lead terminal is connected to the second surface.

According to this application example, since the lead terminal is connected to the second surface opposite to the base, it is possible to prevent the lead terminal from being detached from the first substrate toward the base.

Application Example 5

In the oscillator according to the application example, it is preferable that at least a part of an oscillation circuit element is disposed between the resonator module and the first substrate.

According to this application example, since the oscillation circuit element is disposed at a position close to the resonator module compared with a case where the oscillation circuit element is disposed on a side of the first substrate opposite to the resonator module, it is possible to easily make the temperature of the oscillation circuit element close to the temperature of the resonator module. Accordingly, it is possible to suppress reduction in frequency accuracy due to a temperature difference between the oscillation circuit element and the resonator module.

Application Example 6

In the oscillator according to the application example, it is preferable that a heater is disposed on a surface of the resonator module on the side of the base.

According to this application example, as the resonator module is disposed between the heater and the first substrate, heat of the resonator module does not easily escape, and the resonator module is less affected by the influence of an outside air temperature. Thus, it is possible to enhance accuracy of temperature control of the resonator module.

Application Example 7

In the oscillator according to the application example, it is preferable that, in a plan view in a direction where the base, the resonator module, and the first substrate are arranged, a first connection portion of the lead terminal connected to the first substrate is positioned outside with reference to a contour of the resonator module.

According to this application example, in a plan view, since the first connection portion of the lead terminal connected to the first substrate is disposed outside with reference to the contour of the resonator module, it is possible to easily view the first connection portion of the lead terminal, and to easily confirm a connection state, from the side of the resonator module.

Application Example 8

In the oscillator according to the application example, it is preferable that the lead terminal has three bending portions between a second connection portion connected to the resonator module and the first connection portion.

According to this application example, since the three bending portions are provided in the lead terminal between the second connection portion connected to the resonator module and the first connection portion, it is possible to easily generate deflection in the lead terminal. In other words, it is possible to weaken stiffness of the lead terminal, and thus, it is possible to effectively absorb shock or the like applied to the resonator module.

Application Example 9

In the oscillator according to the application example, it is preferable that the base has a recess on a surface thereof on the side of the resonator module.

According to this application example, it is possible to accommodate other components in the recess provided on the surface on the base of the resonator module, and to enhance efficiency of disposition of the components in the accommodation space.

Application Example 10

In the oscillator according to the application example, it is preferable that the oscillator further includes a second substrate that is disposed on a side of the base opposite to the resonator module and a regulator that adjusts a power supply voltage of the heater is connected to the second substrate.

According to this application example, it is possible to reduce a variation of the power supply voltage applied to the heater using the regulator that adjusts the power supply voltage connected to the second substrate, and to reduce a temperature variation of the heater due to the variation of the power supply voltage.

Application Example 11

An electronic device according to this application example includes an oscillator that includes a case having a base and a cap that is connected to the base to form an accommodation space between the cap and the base, a first substrate that is accommodated in the accommodation space, a lead terminal that is electrically connected to the first substrate, and a resonator module that is electrically connected to the lead terminal and is supported by the lead terminal with a gap with respect to the base; and a controller that performs control based on a signal of the oscillator.

According to this application example, since the oscillator has a smaller size than that of an oscillator of a double-decker structure or has excellent performance and the controller performs control based on a signal of the oscillator, it is possible to provide a small or reliable electronic device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
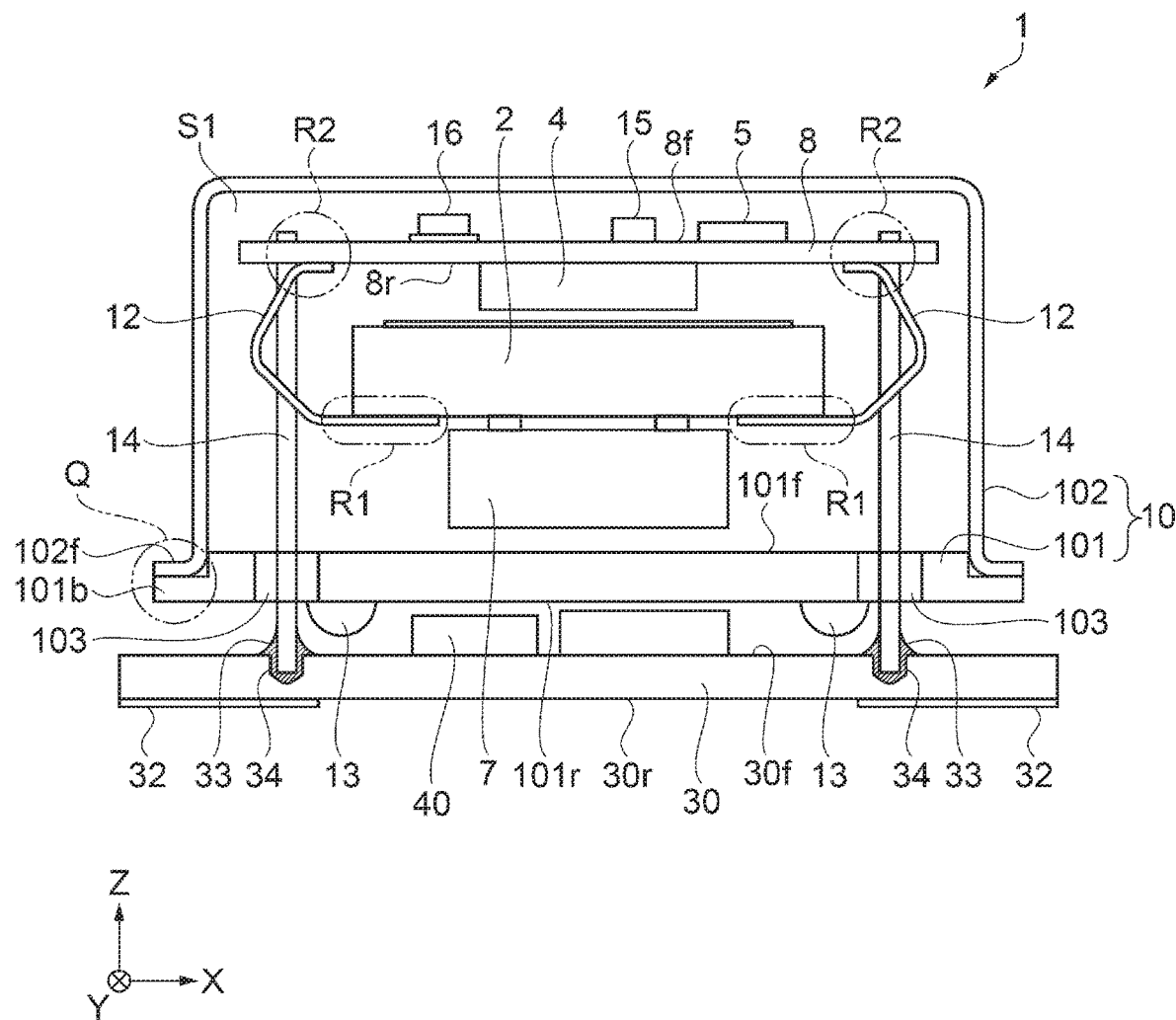
FIG. 1 is a sectional view of an oscillator according to a first embodiment.

Hereinafter, an oscillator and an electronic device according to embodiments of the invention will be described in detail with reference to the accompanying drawings. The embodiments to be described hereinafter do not inappropriately limit content of the invention disclosed in the appended claims. Further, the entire configurations described in the embodiments do not necessarily define essential components of the invention.

In the following drawings, for ease of description, three axes that are orthogonal to each other are set as an X-axis, a Y-axis, and a Z-axis. Here, the Z-axis matches a thickness direction of an oscillator, in other words, a direction in which a base and a cap joined to the base are arranged. In other words, the Z-axis is a direction that matches a direction in which the base, a resonator module accommodated in an accommodation space formed by the base and the cap, and a first substrate are arranged, and is a direction that matches a direction perpendicular to a surface to which a lead terminal that supports an oscillation circuit unit of the first substrate or the resonator module is connected. Further, the X-axis and the Y-axis are orthogonal to each other in a virtual surface that includes a surface to which the oscillation circuit unit of the first substrate is connected. The X-axis extends along a direction in which lead terminals that are arranged in two rows face each other, and the Y-axis extends along an arrangement direction of the lead terminals and an arrangement direction of pin terminals that support the first substrate. Further, a direction parallel to the X-axis is referred to as an "X-axial direction", a direction parallel to the Y-axis is referred to as a "Y-axial direction", and a direction parallel to the Z-axis is referred to as a "Z-axial direction". Further, a direction directing from the base to the first substrate along the Z-axis is referred to as a +Z-axial direction, and a direction opposite to the +Z-axial direction is referred to as a −Z-axial direction. Further, for ease of description, in a plan view when seen from the Z-axial direction, a surface on a side of the +Z-axial direction is set as an upper surface, and a surface on a side of the −Z-axial direction is set as a lower surface. Further, interconnect patterns or electrode pads (terminal electrodes) formed inside a case that includes the base are not shown in the drawings.

First Embodiment

Figure 2:
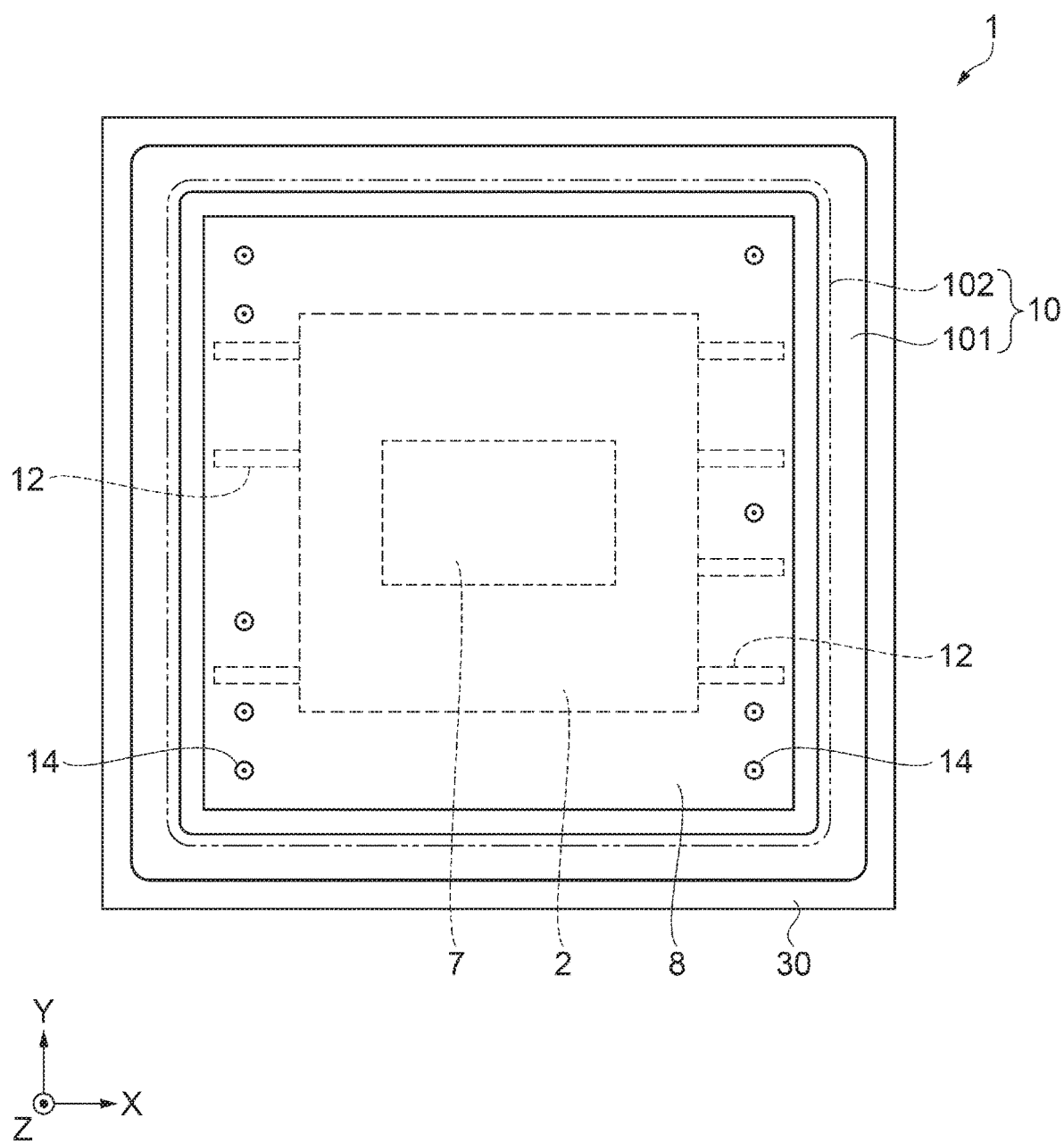
FIG. 2 is a plan view of the oscillator according to the first embodiment.
Figure 3:
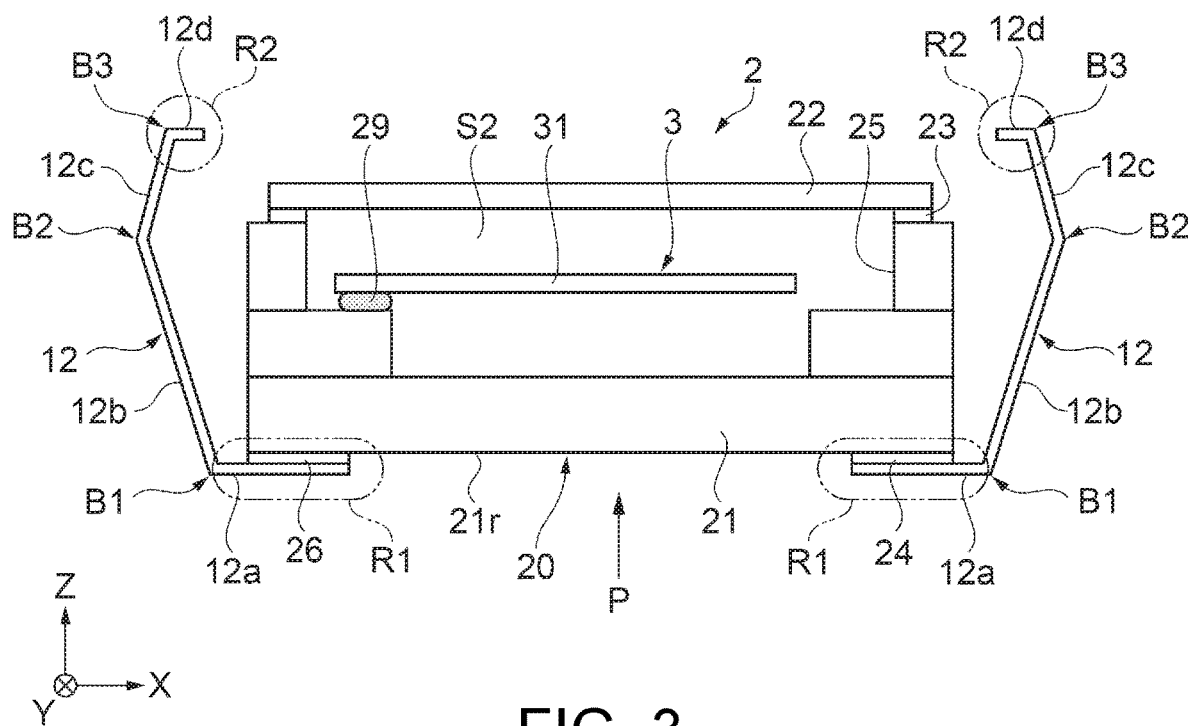
FIG. 3 is a sectional view showing a resonator module and a lead terminal.
Figure 4:
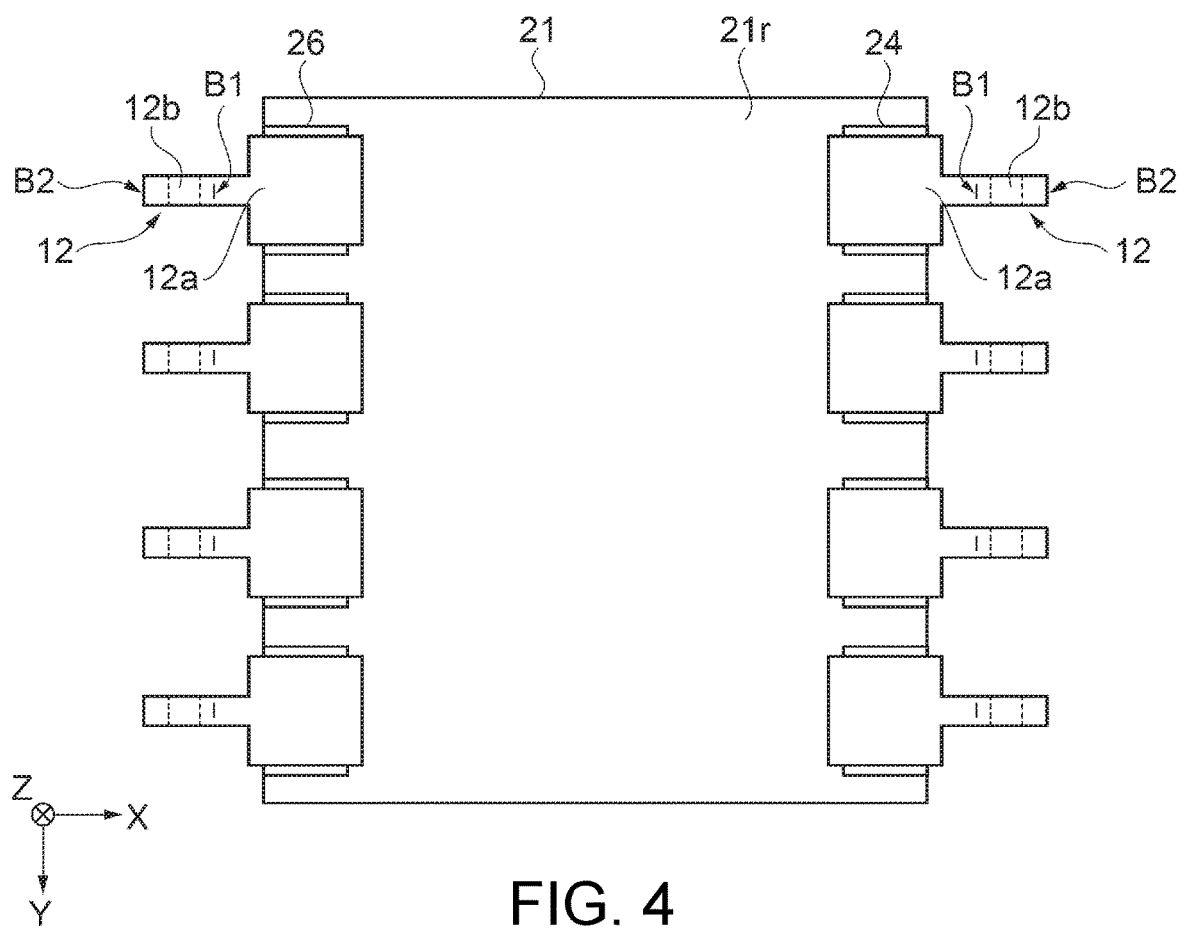
FIG. 4 is a view seen from P in FIG. 3 showing the resonator module and the lead terminal.
Figure 5A:
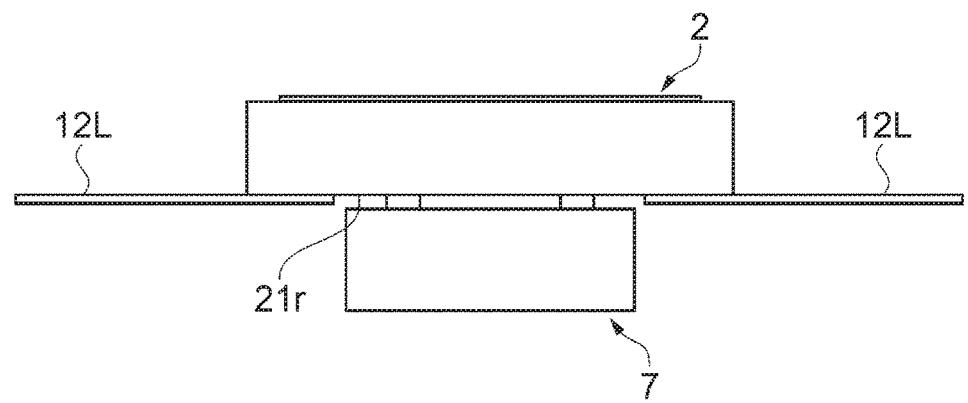
FIG. 5A is a first process diagram showing an example of a forming process of a lead terminal.
Figure 5B:
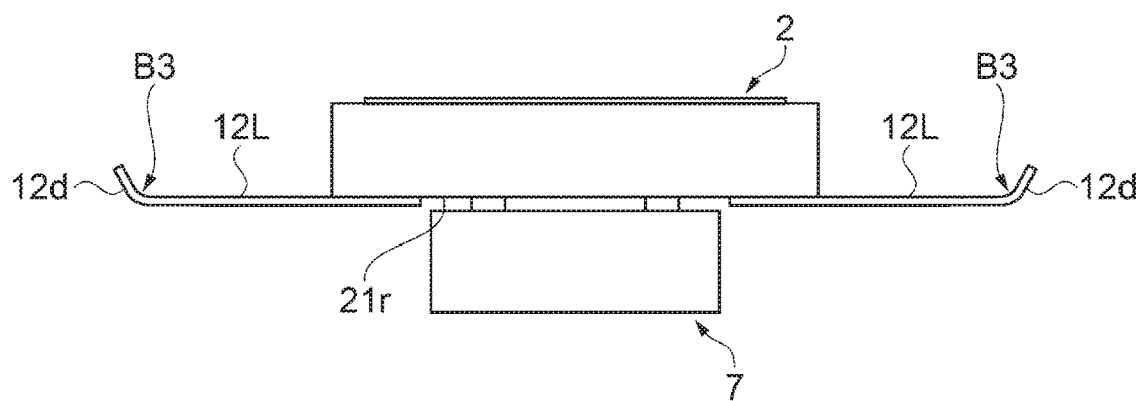
FIG. 5B is a second process diagram showing the example of the forming process of the lead terminal.
Figure 5C:
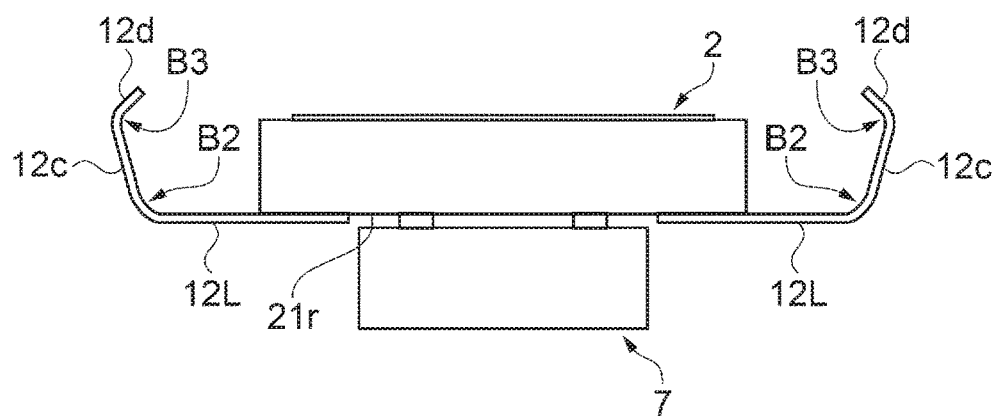
FIG. 5C is a third process diagram showing the example of the forming process of the lead terminal.
Figure 5D:
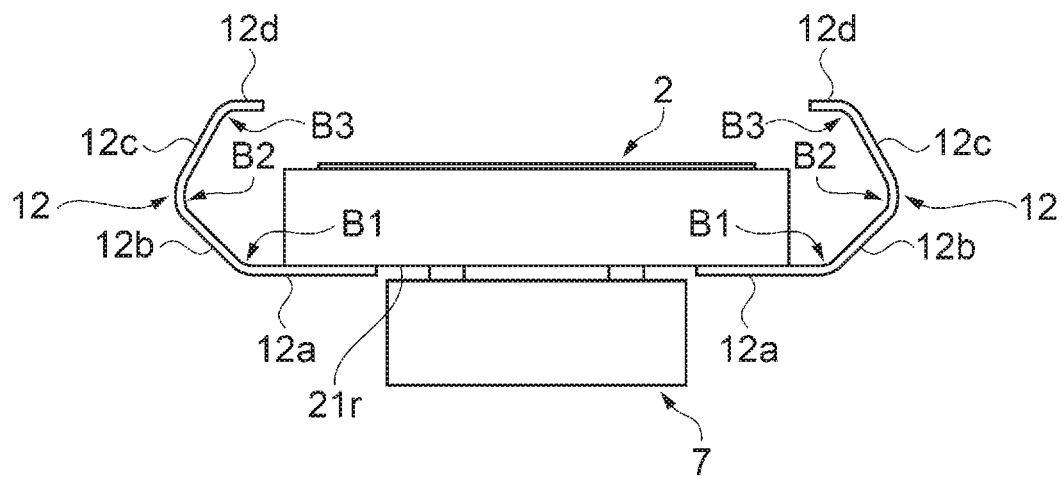
FIG. 5D is a fourth process diagram showing the example of the forming process of the lead terminal.
Figure 6:
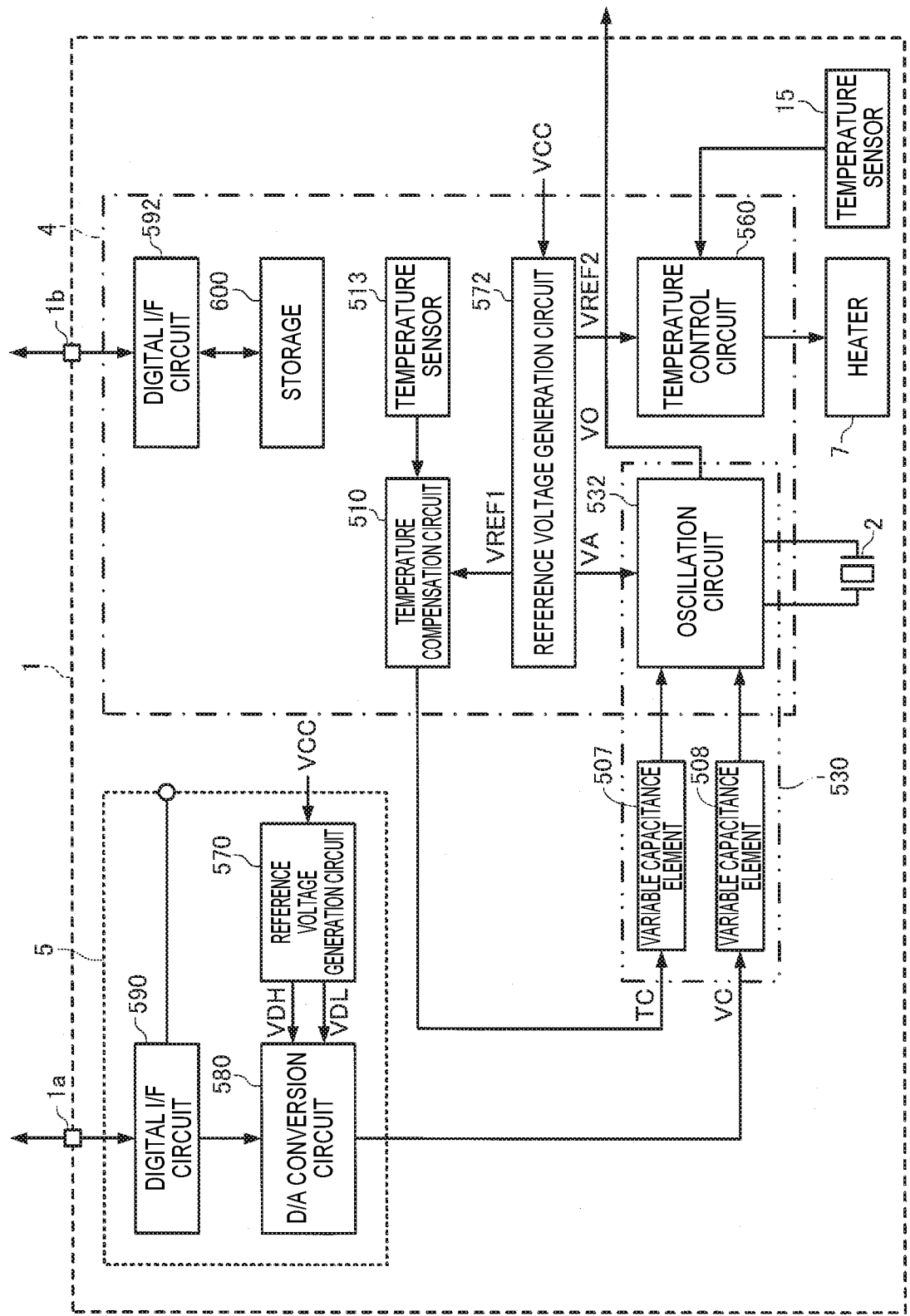
FIG. 6 is a functional block diagram of the oscillator.
Figure 7:
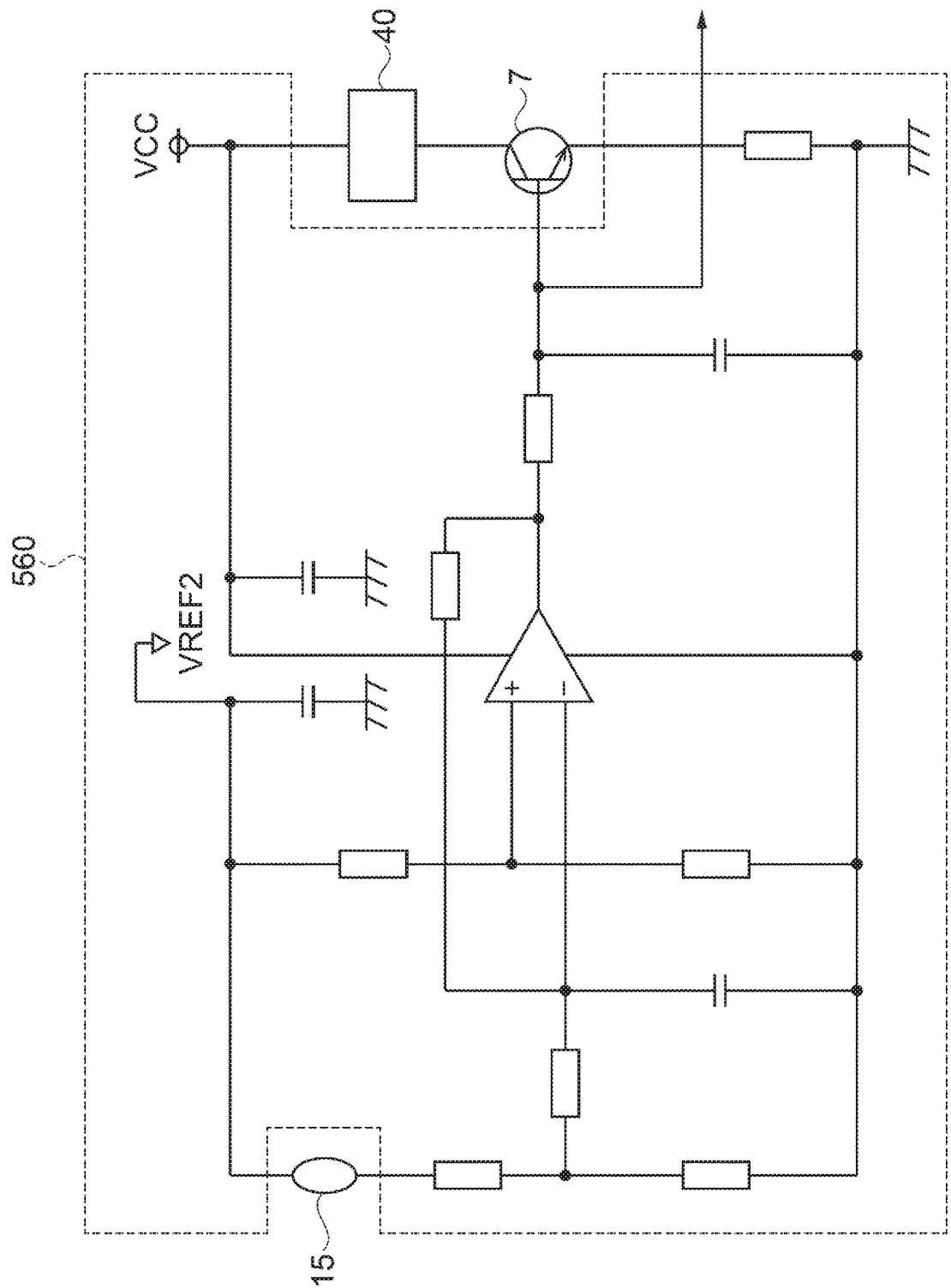
FIG. 7 is a diagram showing a configuration example of a temperature control circuit.

First, an oscillator according to a first embodiment will be described with reference to FIGS. 1 to 7. FIG. 1 is a sectional view of the oscillator according to the first embodiment. FIG. 2 is a plan view of the oscillator according to the first embodiment. In FIG. 2, for ease of description, a perspective view of a cap is shown. FIG. 3 is a sectional view showing a resonator module and a lead terminal accommodated in the oscillator. FIG. 4 is a view seen from P in FIG. 3 showing the resonator module and the lead terminal. FIGS. 5A to 5D are process diagrams showing an example of a forming process of a lead terminal, in which FIG. 5A is a first process diagram, FIG. 5B is a second process diagram, FIG. 5C is a third process diagram, and FIG. 5D is a fourth process diagram. FIG. 6 is a functional block diagram of the oscillator. FIG. 7 is a diagram showing a configuration example of a temperature control circuit.

An oscillator 1 according to the first embodiment is an oven controlled crystal oscillator (OCXO). The oscillator 1 includes a case 10 that includes a base 101 and a cap 102 joined to the base 101, a base substrate 30 that is a second substrate provided on a side of a lower surface 101r of the base 101, and a regulator 40 mounted on an upper surface 30f of the base substrate 30, as shown in FIGS. 1 and 2. The case 10 has an accommodation space (cavity) S1 that is formed by the base 101 and the cap 102 that is provided along an outer periphery of the base 101 and is joined to an upper surface (surface on the +Z-axis side) of a flange 101b that is recessed from an upper surface 101f of the base 101.

In the accommodation space S1 in the case 10, a plurality of pin terminals 14 that are air-tightly sealed by a sealing member 103 and pass through the base 101, which are hermetic terminals, a circuit board 8 that is the first substrate fixed to end portions of the pin terminals 14 on a side opposite to the base 101, and a resonator module 2 that is supported with a gap with respect to the circuit board 8 between the circuit board 8 and the base 101 through the plurality of lead terminals 12 connected to the circuit board 8, are accommodated. Further, a heater 7 is connected, on a side of the base 101, to the resonator module 2 disposed in the accommodation space S1, and an oscillation circuit element 4 that includes an oscillation circuit of the resonator module 2 is connected, on a side of the resonator module 2, to the circuit board 8. In other words, from the side of the base 101, in a sectional view in the Y-axial direction, the respective components, that is, the heater 7 connected to the resonator module 2, the resonator module 2 connected to the circuit board 8 through the lead terminals 12, the oscillation circuit element 4 connected to the circuit board 8, and the circuit board 8 are sequentially disposed in the accommodation space S1.

The base 101 that forms the case 10 is formed of a material such as Kovar, soft iron, or iron nickel, and is provided with the flange 101b in the outer peripheral portion. Further, in the base 101, a plurality of through holes that penetrate from an upper surface 101f to a lower surface 101r are provided, and the conductive pin terminal 14 is inserted into each through hole. Each pin terminal 14 is formed of a hermetic terminal, and a gap between the through hole and the pin terminal 14 is air-tightly sealed by the sealing member 103 such as glass. Further, stand-offs 13 formed of an insulator such as glass may be provided on the lower surface 101r of the base 101.

The pin terminal 14 is an introduction terminal that is formed of a pin member such as Kovar, soft iron, or iron nickel and electrically connects the inside and the outside of the accommodation space S1. Further, the pin terminal 14 has one end on the side of the lower surface 101r of the base 101 and the other end on the side of the accommodation space S1, and is erected along the Z-axial direction. Further, the pin terminals 14 are arranged in two rows along the Y-axial direction. In this embodiment, a row of four pin terminals 14 arranged in the +X-axial direction and a row of five pin terminals 14 arranged in the −X-axial direction are provided, but the number of arrangements or the number of pin terminals does not matter.

Further, the cap 102 that forms the case 10 is provided by forming a thin plate of a metallic material such as nickel silver, Kovar, soft iron or iron nickel through pressing, raising, or the like in a recessed shape, and includes an outer peripheral portion 102f formed by bending outward an opening portion thereof in a flange shape.

Further, as described above, the case 10 has a configuration in which the accommodation space (cavity) S1 is formed by mounting the outer peripheral portion 102f of the cap 102 to overlap the flange 101b of the base 101 and air-tightly joining (air-tightly sealing) a portion Q in which the flange 101b and the outer peripheral portion 102f overlap each other using, for example, a resistance welding process, or the like. The accommodation space S1 is air-tightly sealed to have a reduced pressure atmosphere of a pressure lower than the atmospheric pressure (which may be referred to as vacuum), or an inert gas atmosphere of nitrogen, argon, or helium. As the base 101 and the cap 102 are air-tightly sealed as described above, the inside of the accommodation space S1 is not easily affected by an outside air temperature, and thus, it is possible to enhance the accuracy of temperature control of the resonator module 2 disposed in the accommodation space S1.

The circuit board 8 that is the first board may be configured of a printed circuit board (PCB), for example. The circuit board 8 is formed in a rectangular shape in a plan view seen in the Z-axial direction, and is formed with through holes at positions that face positions where the pin terminals 14 fixed to the base 101 are erected. In addition, the circuit board 8 is fixed to the pin terminals 14 in a state where the ends of the pin terminals 14 on the side of the accommodation space S1 are inserted in the through holes. The circuit board 8 includes a lower surface 8r that is a first surface that is a surface on the side of the base 101, and an upper surface 8f that is a second surface that is a surface opposite to the lower surface 8r.

On the upper surface 8f that is the second surface and the lower surface 8r that is the first surface of the circuit board 8, circuit patterns of circuit interconnects, terminals, or the like (not shown) are provided. Further, for example, a digital to analog (D/A) conversion element 5, a temperature sensor 15, a different electronic element 16, and the like are connected to the circuit pattern on the upper surface 8f of the circuit board 8.

Further, the plurality of lead terminals 12 that support the resonator module 2 and the oscillation circuit element 4 that includes the oscillation circuit of the resonator module 2 are connected to the circuit pattern of the lower surface 8r on the circuit board 8. The lead terminals 12 are connected in connection regions R2 that are positioned on outer peripheral sides of the circuit board 8 and are respectively arranged along two rows in which the pin terminals 14 are connected. In this way, as the lead terminals 12 are connected to the lower surface 8r of the circuit board 8, the lead terminals 12 are disposed between the circuit board 8 and the base 101, and thus, the lead terminals are not easily affected by the outside air temperature through the cap 102. Thus, it is possible to reduce the influence of heat applied to the resonator module 2 from the lead terminals 12. The oscillation circuit element 4 is disposed at an intermediate position between two rows in which the lead terminals 12 are connected, in other words, is positioned at a central portion of the circuit board 8, and is provided at a position that faces the resonator module 2 (which will be described later) supported by the lead terminals 12.

As shown in FIG. 3, the resonator module 2 includes a package 20 having a package base 21 and a lid 22 joined to the package base 21, and a resonator element 3 accommodated in the package 20. The package 20 includes the package base 21 to which the resonator element 3 is mounted, the lid 22 that provides an accommodation space S2 between the lid 22 and the package base 21 to accommodate the resonator element 3 and is joined to the package base 21, and a frame-shaped sealing 23 that is positioned between the package base 21 and the lid 22 and through which the package base 21 and the lid 22 are joined to each other.

The package base 21 has a cavity shape having a recess 25 that is opened in the +Z-axial direction, and has a rectangular shape that is an approximately square shape in an outline shape, in a plan view seen in the Z-axial direction. Here, the outline shape of the package base 21 is not limited to the approximately square shape, and may be a different rectangular shape. Hereinafter, a direction directing from the bottom of the package base 21 toward the opening thereof along the Z-axis is set as the +Z-axial direction, and a direction directing from the opening of the package base 21 toward the bottom thereof along the Z-axis direction is set as the −Z-axial direction. The recess 25 includes a first step that is opened in the +Z-axial direction of the package base 21 and a second step that is opened at the bottom of the first step.

The resonator element 3 is fixed to an internal terminal (not shown) provided at an end portion of the package base 21 through a conductive fixing member 29 such as a conductive adhesive, for example. A quartz crystal board 31 that forms the resonator element 3 is obtained by forming an SC cut quartz crystal board into a planar shape of an approximately circular shape (not shown) through machining, or the like. By using the SC cut quartz crystal board, the resonator element 3 in which a frequency gap or a resistance increase due to spurious vibration is small and a temperature characteristic is also stable is obtained. The planar shape of the quartz crystal board 31 is not limited to the circular shape, and may be a non-linear shape such as an oval shape or an elliptical shape, or may be a linear shape such as a triangular shape or a rectangular shape. Here, by forming the quartz crystal board 31 in the circular shape as in this embodiment, it is possible to enhance symmetry of the quartz crystal board 31, and thus, to effectively reduce oscillation of sub-vibration (spurious vibration).

The resonator element 3 is not limited to the SC cut, and instead, may employ a quartz crystal resonator of an AT cut or a BT cut, a surface acoustic wave (SAW) resonator, or the like, for example. Further, as the resonator element 3, instead of the quartz crystal resonator, for example, a piezoelectric resonator, a micro electro mechanical systems (MEMS) resonator, or the like may be used. As a board material of the resonator element 3, a piezoelectric single crystal material such as quartz crystal, lithium tantalate, or lithium niobate, a piezoelectric material such as piezoelectric ceramics such as lead zirconate titanate, a silicon semiconductor material, or the like may be used. Further, excitation means of the resonator element 3 may use a piezoelectric effect, or may use an electrostatic drive due to a Coulomb force.

The lid 22 has a plate shape, and is joined to an end face of the package base 21 on the +Z-axis side through the sealing 23 to block the opening of the recess 25. The sealing 23 is disposed in a frame shape, and is disposed between the end face of the package base 21 on the +Z-axis side and the lid 22. The sealing 23 is formed of a metallic material, and as the sealing 23 is melt, the package base 21 and the lid 22 are air-tightly joined to each other. In this way, as the opening of the recess 25 is blocked by the lid 22, the second accommodation space (second cavity) S2 is formed, and thus, it is possible to accommodate the resonator element 3 in the second accommodation space S2.

The air-tightly sealed second accommodation space S2 of the package 20 is in a reduced pressure state (for example, about 10 Pa or smaller). Thus, it is possible to continue stable driving of the resonator element 3. In this way, by setting the second accommodation space S2 in the reduced pressure state, the second accommodation space S2 functions as a heat insulating layer, and thus, the resonator element 3 is not easily affected by the influence of outside temperature variation. Here, the atmosphere of the second accommodation space S2 is not particularly limited, and for example, may be filled with an inert gas such as nitrogen or argon to form an atmospheric pressure.

A component material of the package base 21 is not particularly limited, and for example, may employ various types of ceramics such as aluminum oxide. In this case, the package base 21 may be manufactured by sintering a laminated body of ceramic sheets (green sheets). Further, a component material of the lid 22 is not particularly limited, and may employ a member having a linear expansion coefficient similar to that of the component material of the package base 21 and approximate. For example, in a case where the component material of the package base 21 is ceramics as described above, it is preferable that the component material of the lid 22 is a metallic material (for example, an alloy such as Kovar).

On a lower surface 21r of the package base 21, for example, a plurality of first connection terminals 24 and a plurality of second connection terminals 26 that are electrically connected to the resonator element 3 using an internal interconnect (not shown) are provided. Specifically, as shown in FIG. 4, four first connection terminals 24 are arranged along an outer edge disposed on the side of the +X-axial direction, and four second connection terminals 26 are arranged along an outer edge disposed on the opposite side of the −X-axial direction. The number of first connection terminals 24 and the number of second connection terminals 26 are not particularly limited, and may be arbitrarily set. The first connection terminals 24 and the second connection terminals 26 may be formed, for example, using a method for sintering a metallic interconnect material such as tungsten (W) or molybdenum (Mo) on the lower surface 21r of the package base 21 through screen printing and performing plating of nickel (Ni), gold (Au), or the like thereon. Hereinafter, the lower surface 21r of the package base 21 may be referred to as the lower surface 21r of the resonator module 2 as necessary.

A second connection portion 12a of the lead terminal 12 is electrically connected and fixed to each of the first connection terminals 24 and the second connection terminals 26 that are provided on the lower surface 21r of the resonator module 2, for example, using a conductive adhesive, soldering, or the like. The resonator module 2 is supported in a so-called suspended state on the circuit board 8 through the lead terminals 12 in a state where first connection portions 12d of the lead terminals 12 are electrically connected and fixed to the lower surface 8r of the circuit board 8.

Each lead terminal 12 includes the second connection portion 12a provided at a position that includes one end thereof, the first connection portion 12d provided at a position that includes the other end thereof, and a first extension portion 12b and a second extension portion 12c that are positioned between the second connection portion 12a and the first connection portion 12d and are connected to each other at a second bending portion B2. Further, the second connection portion 12a and the first extension portion 12b are connected to each other at a first bending portion B1, and the first connection portion 12d and the second extension portion 12c are connected to each other at a third bending portion B3. In other words, the lead terminal 12 includes three bending portions of the first bending portion B1, the second bending portion B2, and the third bending portion B3 between the second connection portion 12a connected to the resonator module 2 and the first connection portion 12d.

Further, more specifically, each lead terminal 12 includes the second connection portion 12a provided at the position including one end thereof, the first extension portion 12b that extends from the second connection portion 12a and is bent in a direction of being gradually spaced from the resonator module 2 at the first bending portion B1, the second extension portion 12c that extends from the first extension portion 12b and is bent in a direction of being gradually close to the resonator module 2 at the second bending portion B2, and the first connection portion 12d that extends from the second extension portion 12c and is bent that is approximately parallel to the lower surface 21r of the package base 21 that forms the resonator module 2 at the third bending portion B3. In other words, the lead terminal 12 has a configuration in which the second connection portion 12a is connected to the first connection terminal 24 and the second connection terminal 26 of the resonator module 2 and the first connection portion 12d is connected to the lower surface 8r of the circuit board 8 while protruding at the second bending portion B2 in an outward direction with a gap with respect to an outer side surface of the resonator module 2.

As described above, the three bending portions of the first bending portion B1, the second bending portion B2, and the third bending portion B3 are provided in the lead terminal 12 between the second connection portion 12a connected to the resonator module 2 and the first connection portion 12d connected to the circuit board 8, and the resonator module 2 is supported in a so-called suspended state with respect to the circuit board 8, and thus, it is possible to easily generate deflection in the lead terminal 12. Further, since the lead terminal 12 is configured to protrude at the second bending portion B2 in the outward direction of the resonator module 2, it is possible to weaken stiffness of the lead terminal 12, and to effectively absorb shock or the like applied to the resonator module 2 from the circuit board 8.

In addition, it is preferable that the lead terminal 12 is configured so that the first connection portion 12d of the lead terminal 12 connected to the circuit board 8, in a plan view in a direction where the resonator module 2 and the circuit board 8 are arranged, that is, in the +Z-axial direction is disposed outside with reference to the contour of the resonator module 2. As the first connection portion 12d of the lead terminal 12 connected to the circuit board 8 is disposed outside with reference to the contour of the resonator module 2, in a plan view as described above, it is possible to easily visually recognize the first connection portion 12d of the lead terminal 12 from the side of the resonator module 2, and to easily confirm a connection state.

A configuration in which four lead terminals 12 are disposed on the side of the first connection terminals 24 of the resonator module 2 and four lead terminals 12 are disposed on the side of the second connection terminals 26 is shown, but the number of the lead terminals 12 is not limited thereto. Any number of lead terminals 12 that is able to support the resonator module 2 may be used. Further, the lead terminal 12 may be formed in processes shown in FIGS. 5A to 5D, for example.

First, in a first process shown in FIG. 5A, a lead frame in which terminals 12L corresponding to the lead terminals 12 (see FIG. 3) are continuously connected to a frame is prepared, and one end portion of each of the terminals 12L continuously connected to the lead frame is connected to the lower surface 21r of the resonator module 2 to which the heater 7 is connected. Although not shown, a part that includes one end portion of each of the terminals 12L continuously connected to the lead frame and connected to the resonator module 2 corresponds to the second connection portion 12a of the lead terminal 12 after formation.

Then, in a second process shown in FIG. 5B, the third bending portion B3 is formed in a tip portion of the terminal 12L using pressing or the like, and the first connection portion 12d is formed by bending the terminal 12L inward at a predetermined angle. The predetermined angle is set so that the first connection portion 12d is approximately parallel to the lower surface 21r of the resonator module 2 when bending in a fourth process (which will be described later) is performed.

Then, in a third process shown in FIG. 5C, the second bending portion B2 is formed in a central portion of the terminal 12L using pressing or the like, and the second extension portion 12c is formed by bending the terminal 12L inward at a predetermined angle.

Then, in the fourth process shown in FIG. 5D, the first bending portion B1 is formed in a portion of the terminal 12L adjacent to the resonator module 2 using pressing or the like, and the first extension portion 12b and the second connection portion 12a are formed by bending the terminal 12L further inward at a predetermined angle. Further, although not shown, by separating the portions of the terminal 12L formed in the above-described processes from the lead frame, it is possible to form the lead terminal 12 in a state of being connected to the resonator module 2.

The oscillation circuit element 4 at least includes an oscillation circuit 530 (see FIG. 6) that is an oscillation circuit that oscillates the resonator module 2, and is disposed between the resonator module 2 and the circuit board 8. At least a part of the oscillation circuit element 4 may be included between the resonator module 2 and the circuit board 8. In a case where the oscillation circuit element 4 is disposed as described above, since the oscillation circuit element 4 is disposed to be close to the resonator module 2 compared with a case where the oscillation circuit element 4 is disposed at a side of the circuit board 8 opposite to the resonator module 2, it is possible to easily make the temperature of the oscillation circuit element 4 close to the temperature of the resonator module 2. Accordingly, it is possible to suppress reduction in frequency accuracy due to a temperature difference between the oscillation circuit element 4 and the resonator module 2.

The heater 7 is an electronic component having a so-called "constant temperature function", which is connected to the lower surface 21r that is the surface of the resonator module 2 on the side of the base 101, heats the oscillation circuit element 4 through the resonator element 3 of the resonator module 2 or the resonator module 2, and maintains the temperatures of the resonator module 2 (resonator element 3) and the oscillation circuit element 4 approximately uniformly. By approximately uniformly maintaining the temperatures of the resonator module 2 (resonator element 3) and the oscillation circuit element 4, it is possible to reduce a variation of oscillation frequency due to an outside (operating environment) temperature variation, and to maintain excellent frequency stability. In the oscillator 1 of this embodiment, it is preferable to control the temperature of the resonator element 3 to be close to a peak temperature (which varies as specifications, for example, about 70° C. to about 100° C.) indicating a zero temperature coefficient. Thus, it is possible to achieve more excellent frequency stability.

Further, as the heater 7 is connected to the lower surface 21r that is the surface of the resonator module 2 on the side of the base 101, in other words, as the resonator module 2 is disposed between the heater 7 and the circuit board 8, heat of the resonator module 2 hardly escapes, and the resonator module is less effected by the influence of the outside air temperature. Thus, it is possible to enhance accuracy of temperature control of the resonator module 2.

The D/A conversion element 5 connected to the circuit board 8 includes a reference voltage generation circuit 570, a D/A conversion circuit 580, a digital interface circuit 590, and the like shown in FIG. 6, processes a signal input through an external terminal 1a of the oscillator 1, and outputs a frequency-controlled signal. Here, the D/A conversion element 5 may have a configuration in which a part of these components is omitted or modified or other components are added thereto.

The temperature sensor 15 connected to the circuit board 8 is disposed in the vicinity of the resonator module 2, and detects the temperature (temperature of a thermostatic chamber) of the resonator module 2. As the temperature sensor 15, for example, a thermistor (a negative temperature coefficient (NTC) thermistor, a positive temperature coefficient (PTC) thermistor, or the like), a platinum resistance, or the like may be used.

The base substrate 30 that is the second substrate provided on the side of the lower surface 101r of the base 101 may be configured of a printed circuit board (PCB), for example. The base substrate 30 includes an upper surface 30f disposed on the size of the base 101 and a lower surface 30r that is a surface opposite to the upper surface. The base substrate 30 is provided with a bottomed hole 34 on the upper surface 30f that faces at a position where each pin terminal 14 fixed to the base 101 is erected. The base substrate 30 is connected to the pin terminal 14 using a joining material 33 such as soldering in a state where one end of the pin terminal 14 is inserted into the bottomed hole 34. Further, the regulator 40 is connected to the upper surface 30f of the base substrate 30. In addition, a plurality of external connection terminals 32 are provided on the lower surface 30r of the base substrate 30.

The regulator 40 that is connected to the upper surface 30f of the base substrate 30 has a function of a voltage regulator that smoothens an input DC power and outputs the result as a constant voltage, and adjusts a power supply voltage supplied to the heater 7 to become constant. The regulator 40 may output a constant voltage even though an input voltage or an output current is changed. By providing the regulator 40, it is possible to reduce a variation of the power supply voltage applied to the heater 7, and to reduce a temperature variation of the heater 7 due to the variation of the power supply voltage.

Next, a functional configuration of the oscillator 1 according to the first embodiment will be described with reference to the functional block diagram shown in FIG. 6. The same description as in the above-described configuration will not be repeated. As shown in FIG. 6, the oscillator 1 includes the resonator module 2, the D/A conversion element 5, the oscillation circuit element 4 including an oscillation circuit, a variable capacitance element 507, a variable capacitance element 508, the heater 7 that is a temperature control element, and the temperature sensor 15. Here, the oscillator 1 of this embodiment may have a configuration in which a part of the components shown in FIG. 6 is omitted or modified or other components are added thereto.

The D/A conversion element 5 may be configured to include the reference voltage generation circuit 570, the D/A conversion circuit 580, and the digital interface circuit 590. Here, the D/A conversion element 5 may have a configuration in which a part of the components is omitted or modified or other components are added thereto.

The digital interface circuit 590 is electrically connected to the external terminal 1a of the oscillator 1, acquires a signal (a signal including digital data for controlling the frequency of the oscillation circuit 530) input from the external terminal 1a, converts the signal into an N-bit data signal, and outputs the result to the D/A conversion circuit 580.

The reference voltage generation circuit 570 generates a high potential reference voltage VDH and a low potential reference voltage VDL of the D/A conversion circuit 580 based on a power supply voltage VCC supplied from the outside (the outside of the oscillator 1) of the D/A conversion circuit 5.

The D/A conversion circuit 580 generates a frequency control signal for converting a digital signal input through the digital interface circuit 590 into an analog signal to control the frequency of the oscillation circuit 530. Specifically, the D/A conversion circuit 580 receives an input of an N-bit data signal (digital data for controlling the frequency of the oscillation circuit 530) output from the digital interface circuit 590, and converts the N-bit data signal into an analog signal of a voltage between the high potential reference voltage VDH and the low potential reference voltage VDL, and outputs the result. As the D/A conversion circuit 580, various types such as a resistance division type (which may be referred to as a voltage distribution type, a resistance string type, or a voltage potentiometer type), a resistance ladder type (an R-2R ladder type, or the like), a capacitance array type, or a delta-sigma type that are well known may be used.

A voltage (control voltage) VC of an analog signal output from the D/A conversion circuit 580 is applied to the variable capacitance element 508 outside the D/A conversion circuit 5, and a capacitance value of the variable capacitance element 508 is changed according to the control voltage VC. The variable capacitance element 508 may be a varicap diode (varactor) in which a capacitance value is changed according to the control voltage VC applied to one end thereof, for example.

The oscillation circuit element 4 includes a temperature compensation circuit 510, a temperature sensor 513, an oscillation circuit 532, a temperature control circuit 560, a reference voltage generation circuit 572, a digital interface circuit 592, and a storage 600. The oscillation circuit element 4 is an integrated circuit (IC), or the like, for example. Here, the oscillation circuit element 4 may have a configuration in which a part of the components is omitted or modified or other components are added thereto.

The temperature compensation circuit 510 is connected to the temperature sensor 513, and generates a temperature compensation voltage TC for correcting frequency-temperature characteristics of an output signal of the oscillation circuit 530 according to an output signal of the temperature sensor 513.

The temperature sensor 513 outputs a voltage based on an ambient temperature, for example. The temperature sensor 513 may be a positive polarity sensor in which an output voltage is higher as the temperature is higher, or may be a negative polarity sensor in which an output voltage is lower as the temperature is higher.

A temperature compensation voltage TC output from the temperature compensation circuit 510 is applied to the variable capacitance element 507 outside the oscillation circuit element 4, and a capacitance value of the variable capacitance element 507 is changed according to the temperature compensation voltage TC. The variable capacitance element 507 may be a varicap diode (varactor) in which a capacitance value is changed according to the temperature compensation voltage TC applied to one end thereof, for example.

The oscillation circuit 532 forms the oscillation circuit 530 that oscillates the resonator module 2 together with the variable capacitance element 507, the variable capacitance element 508, and other electronic components (not shown) externally attached to a terminal of the oscillation circuit element 4. That is, in this embodiment, the oscillation circuit element 4 includes the oscillation circuit 532 that is a part of the oscillation circuit 530, but the oscillation circuit element 4 may be configured to have at least a part of the oscillation circuit 530, for example, to have the entirety of the oscillation circuit 530.

The oscillation circuit 530 oscillates the resonator module 2 at a frequency based on the capacitance value of the variable capacitance element 507 and the capacitance value of the variable capacitance element 508, and outputs an oscillation signal VO. The oscillation signal VO output from the oscillation circuit 530 is output to the outside (the outside of the oscillator 1) of the oscillation circuit element 4.

The temperature control circuit 560 is disposed in the vicinity of the resonator module 2, and controls an operation of the heater 7 for controlling the temperature of the resonator module 2 based on an output voltage of the temperature sensor 15 that detects the temperature (temperature of the thermostatic chamber) of the resonator module 2. Specifically, the temperature control circuit 560 controls the operation of the heater 7 to uniformly maintain the temperature of the resonator module 2 according to the output voltage of the temperature sensor 15.

As the heater 7, for example, a heater element (a power transistor, a resistor, or the like) that generates heat as an electric current flows, or a heat absorbing element (a Peltier element, or the like) may be used.

The reference voltage generation circuit 572 generates a power supply voltage VA of the oscillation circuit 530, a reference voltage VREF1 of the temperature compensation circuit 510, a reference voltage VREF2 of the temperature control circuit 560, or the like, based on the power supply voltage VCC supplied from the outside (the outside of the oscillator 1) of the oscillation circuit element 4.

The storage 600 stores information based on a digital signal input through the digital interface circuit 592. For example, the storage 600 includes a non-volatile memory (not shown) and a register (not shown), and setting information or the like of the temperature compensation circuit 510 is stored in the non-volatile memory. The non-volatile memory may be realized by a flash memory such as a metal-oxide-nitride-oxide-silicon (MONOS) memory, an electrically erasable programmable read-only memory (EEPROM), or the like, for example.

Each piece of setting information stored in the non-volatile memory is transmitted to the register from the non-volatile memory in a case where power is supplied to the oscillation circuit element 4 (in a case where the power supply voltage VCC increases from 0V to a desired voltage), and is maintained in the register. Further, each piece of setting information maintained in the register is supplied to the temperature compensation circuit 510, or the like.

The digital interface circuit 592 is electrically connected to the external terminal 1b different from the external terminal 1a of the oscillator 1, acquires a signal input through the external terminal 1b, and performs reading and writing with respect to the storage 600 (the non-volatile memory and the register). The digital interface circuit 592 may be, for example, an interface circuit corresponding to an inter-integrated circuit ($I^2C$) bus, or an interface circuit corresponding to a serial peripheral interface (SPI).

FIG. 7 is a diagram showing a configuration example of the temperature control circuit 560. In FIG. 7, a NPN-type power transistor is used as the heater 7, and an NTC thermistor is used as the temperature sensor 15. In the temperature control circuit 560 shown in FIG. 7, in a case where the temperature decreases, a resistance value of the temperature sensor 15 (NTC thermistor) increases, and an input potential difference of an operational amplifier increases. Contrarily, in a case where the temperature increases, the resistance value of the temperature sensor 15 decreases, and the input potential difference of an operational amplifier decreases. An output voltage of the operational amplifier is proportional to an input potential difference. In the heater 7 (NPN-type power transistor), in a case where the output voltage of the operational amplifier is higher than a predetermined voltage value, as a voltage value is high, an electric current flows, and the amount of generated heat increases. In a case where the output voltage of the operational amplifier is lower than the predetermined voltage value, an electric current does not flow, and the amount of generated heat gradually decreases. Accordingly, the operation of the heater 7 is controlled so that the resistance value of the temperature sensor 15 becomes a desired value, that is, so that a desired temperature is maintained.

An internal temperature of the thermostatic chamber is controlled to be maintained as a desired temperature (for example, in a case where the resonator module 2 is a SC cut quartz crystal resonator, a temperature that becomes a peak of an upward projection in a three-dimensional curve of a frequency temperature characteristic), by the temperature control circuit 560, based on the frequency temperature characteristic of the output signal of the oscillation circuit 530 determined according to the temperature characteristic of the resonator module 2 or the oscillation circuit element 4.

Further, the regulator 40 having a function of a voltage regulator that adjusts the power supply voltage supplied to the heater 7 to become uniform is provided between the temperature control circuit 560 and the heater 7. Since the regulator 40 is able to output a constant voltage even though an input voltage or an output current is changed, it is possible to reduce a variation of the power supply voltage applied to the heater 7, and to reduce a temperature variation of the heater 7 due to the variation of the power supply voltage.

According to the oscillator 1 according to the first embodiment with such a configuration, the resonator module 2 is supported with a gap with respect to the circuit board 8 between the circuit board 8 and the base 101 through the lead terminal 12 connected to the circuit board 8 accommodated in the case 10 configured of the base 101 and the cap 102. In other words, the resonator module 2 is supported in a so-called suspended state between the circuit board 8 and the base 101 through the lead terminal 12. As described above, as the resonator module 2 is supported in the suspended state between the base 101 and the circuit board 8, components such as the resonator module 2, the heater 7, or the oscillation circuit element 4 are easily and tightly disposed in a space between the base 101 and the circuit board 8, compared with a case where the resonator module 2 has a double-decker structure, and thus, it is possible to achieve miniaturization. Further, in the case of the same size as that of the double-decker structure, it is possible to secure a room in the space between the base 101 and the circuit board 8 to obtain the freedom of design for enhancement of performance.

Further, as the accommodation space (cavity) S1 that accommodates components such as the resonator module 2 or the oscillation circuit element 4 is air-tightly sealed by the base 101 and the cap 102, it is possible to enhance the function of the thermostatic chamber in the accommodation space (cavity) S1. That is, it is possible to control accuracy of an oscillation characteristic generated as a control temperature of the resonator module 2 or the oscillation circuit element 4 in the accommodation space (cavity) S1 is affected by the outside air temperature outside the cap 102.

Figure 8:
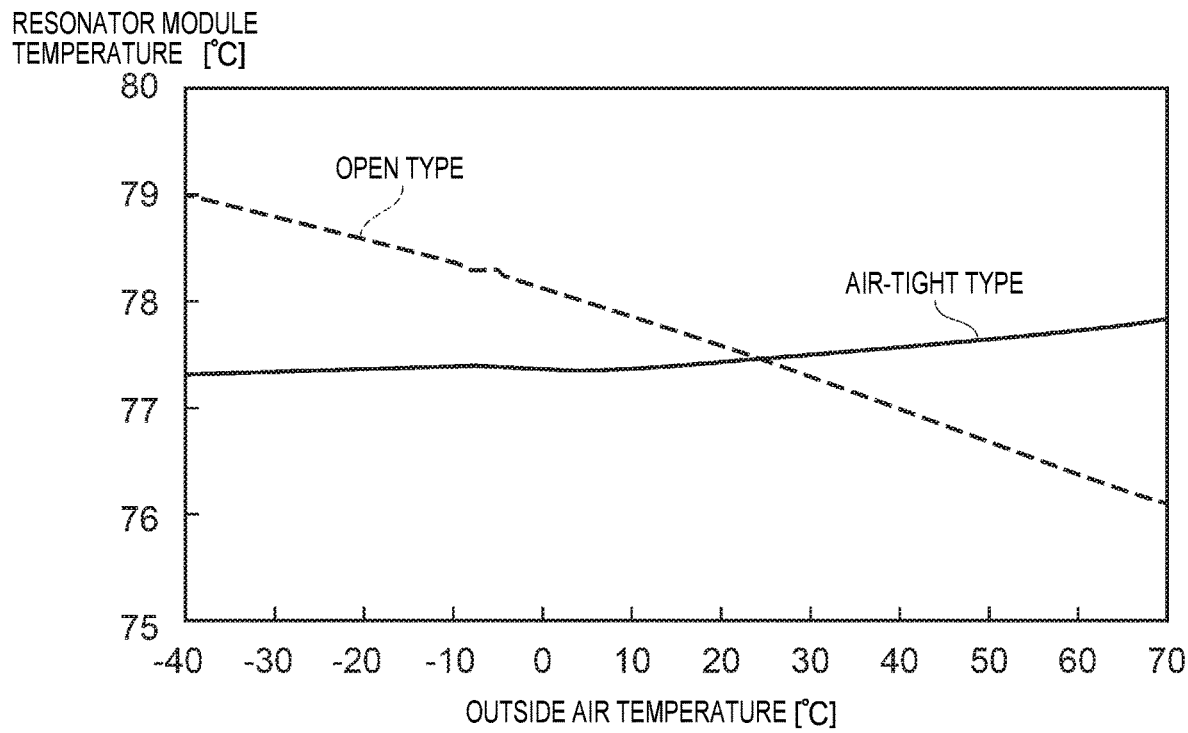
FIG. 8 is a graph showing a temperature change, due to an outside air temperature, of the resonator module accommodated in the oscillator according to the first embodiment.

A confirmation result of effects relating to the above-described air-tight sealing will be described with reference to FIG. 8. FIG. 8 is a graph showing a temperature change, due to the outside air temperature, of the resonator module 2 accommodated in the oscillator 1 according to the first embodiment. In the graph shown in FIG. 8, the oscillator 1 of this embodiment is referred to as an air-tight type, and an oscillator that has the related-art so-called double-decker structure and is not air-tightly sealed that is a comparison target is referred to as an open-type.

As shown in the graph of FIG. 8, in the oscillator (open-type) of the related-art so-called double-decker structure, as the outside air temperature increases, the temperature of the resonator module 2 gradually decreases to show a temperature variation of 3° C. between −40° C. to +70° C. This occurs since the temperature control of the heater 7 that controls the temperature of the resonator module 2 is not performed as expected. That is, in the oscillator (open-type) of the related-art so-called double-decker structure, since cooperation between the temperature sensor 15 and the temperature control circuit 560 that are provided therein is not sufficiently achieved, the control temperature is easily affected by the influence of the outside air temperature intruded in the accommodation space S1. For example, the temperature control circuit 560 over-reacts with respect to the outside air temperature, or contrarily, under-reacts therewith. Specifically, it is considered that the power supply power applied to the heater 7 becomes excessive in a case where the outside air temperature is low, and contrarily, the power supply power applied to the heater 7 becomes too small in a case where the outside air temperature is high, and thus, the above-described phenomenon occurs.

On the other hand, in the oscillator 1 (air-tight type) of this embodiment, the temperature of the resonator module 2 also tends to increase as the outside air temperature increases, in which the temperature variation is a small value of only 0.5° C. between −40° C. and +70° C., which is a temperature variation of about ⅙ compared with that in the related-art oscillator. Thus, it can be obviously understood that the temperature variation of the resonator module 2 is small. It is considered that this is because since there is no intrusion of outside air into the accommodation space (cavity) S1, the influence of the outside air temperature is small, and thus, the temperature control of the heater 7 that controls the temperature of the resonator module 2 is performed as expected.

Further, since the lead terminal 12 that supports the resonator module 2 in the suspended state extends from a connection portion with respect to the circuit board 8 disposed in the connection region R2 to a connection portion disposed in the connection region R1 of the lower surface 21*r* of the resonator module 2 on the side opposite to the circuit board 8, it is possible to set the length to be sufficiently long. Further, since the lead terminal 12 has the swelling portion at the second bending portion B2 in the outward direction of the resonator module 2 by three bending portions of the first bending portion B1, the second bending portion B2, and the third bending portion B3, it is possible to weaken the stiffness of the lead terminal 12. Thus, deflection of the lead terminal 12 easily occurs, and shock is absorbed by the deflection of the lead terminal 12. Thus, it is possible to reduce the influence of the shock with respect to the resonator module 2.

Figure 9:
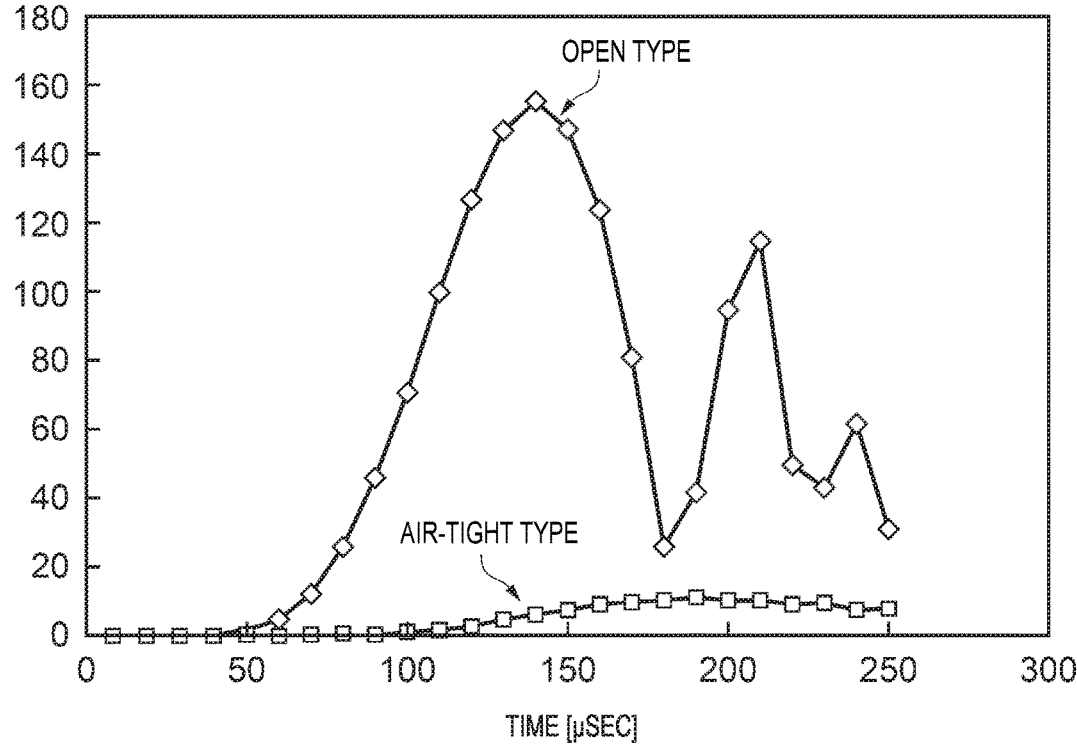
FIG. 9 is a graph showing a simulation result of a stress generated in amount portion of a resonator element of the resonator module when shock is applied thereto.

The above-described confirmation result of the effect relating to the reduction of the influence of the shock with respect to the resonator module 2 will be described with reference to FIG. 9. FIG. 9 is a graph showing a simulation result of stress generated in amount portion (a joining portion with respect to the package base 21) of the resonator element 3 of the resonator module 2 when shock is applied to the oscillator 1. In the graph shown in FIG. 9, the oscillator 1 of this embodiment is referred to as an air-tight type, and an oscillator of the related-art so-called double-decker structure that is a comparison target is referred to as an open-type.

As shown in the graph of FIG. 9, in the oscillator (open-type) of the related-art so-called double-decker structure, stress is large, and a peak at which the stress is large gradually attenuates with the lapse of time. On the other hand, in the oscillator 1 (air-tight type) of this embodiment, it can be understood that a peak at which the stress is slightly large appears with the lapse of time but the size of the stress at the time of peak is outstandingly small compared with the oscillator (open-type) of the related-art so-called double-decker structure. In this way, in the oscillator 1 (air-tight type) of this embodiment, it can be understood that shock applied to the oscillator is absorbed by deflection of the lead terminal 12 and the effect of reducing the influence of the shock with respect to the resonator module 2 is remarkable.

Further, since the resonator module 2 is supported by the long lead terminal 12, it is possible to lengthen a distance to the cap 102 that is in contact with outside air, disposed on the side of the circuit board 8, the circuit board 8, or the like, and to reduce the influence due to the outside air temperature on the resonator module 2. Thus, it is possible to provide the oscillator 1 having a good temperature control with excellent impact resistance with respect to the resonator module 2 without increasing its external shape.

Second Embodiment

Figure 10:
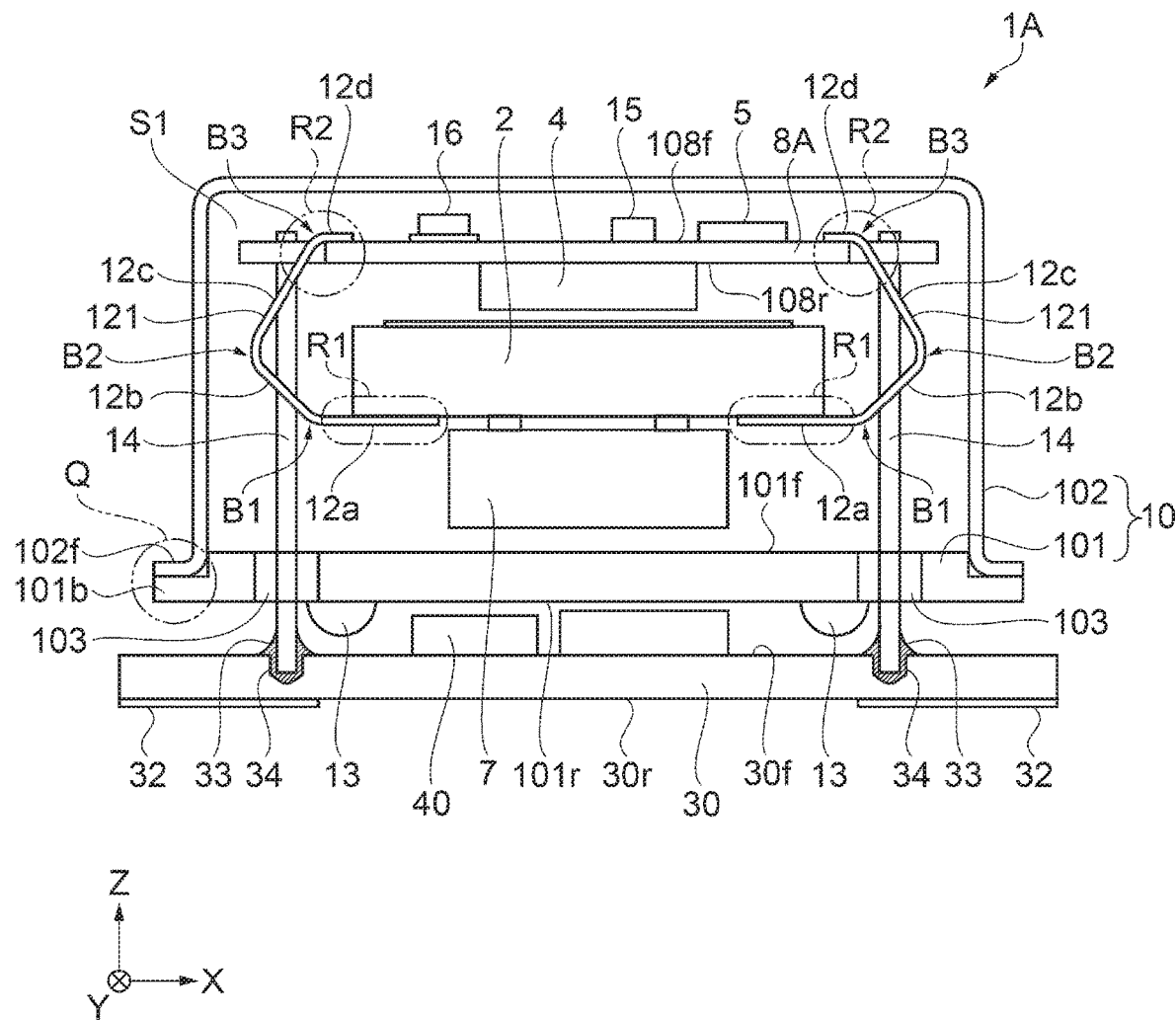
FIG. 10 is a sectional view of an oscillator according to a second embodiment.
Figure 11:
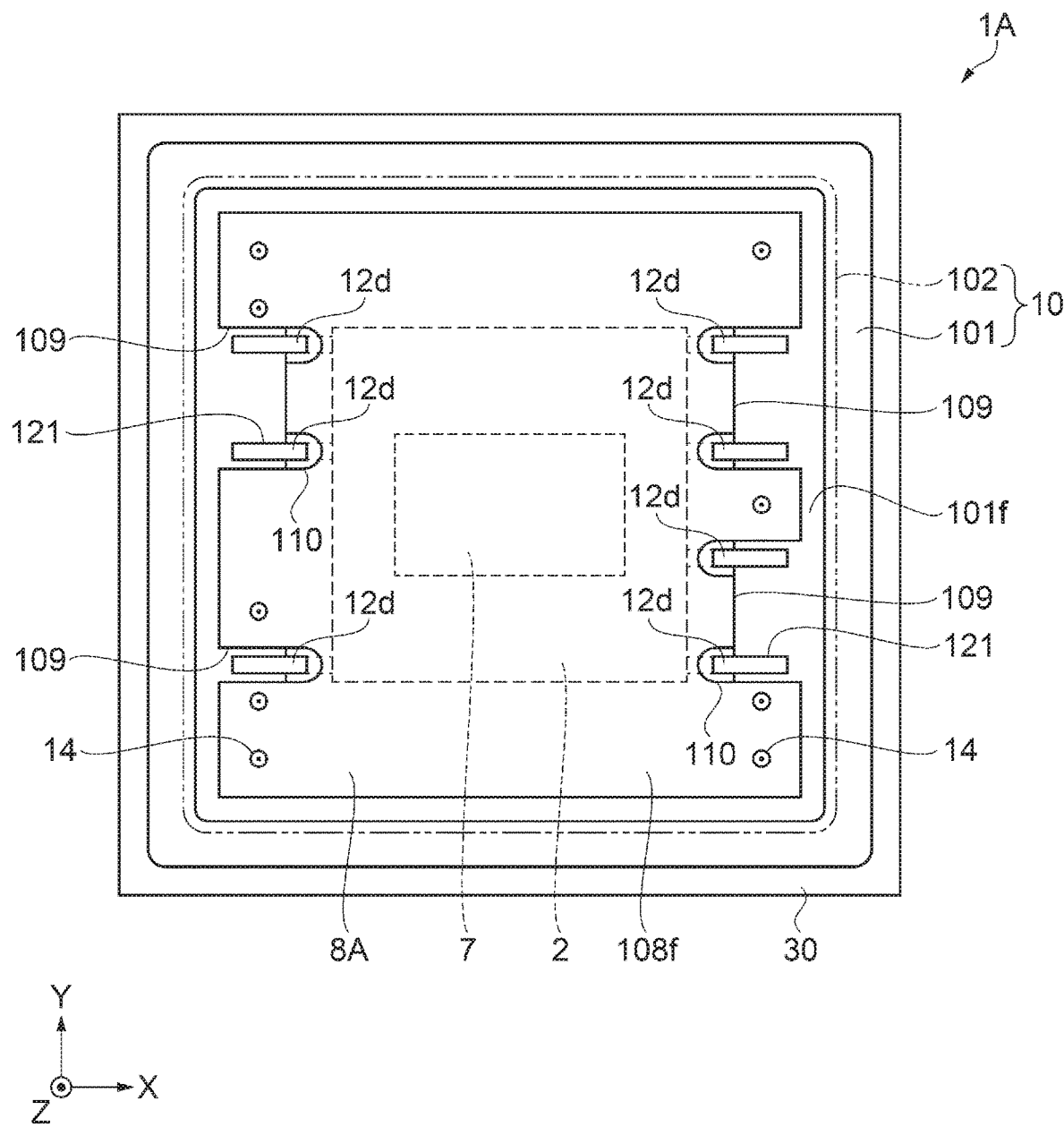
FIG. 11 is a plan view of the oscillator according to the second embodiment.

Next, an oscillator according to a second embodiment will be described in detail with reference to FIGS. 10 and 11. FIG. 10 is a sectional view of the oscillator according to the second embodiment. FIG. 11 is a plan view of the oscillator according to the second embodiment. In the following description according to the second embodiment, configurations different from those of the first embodiment will be mainly described. Further, in the respective drawings, the same reference numerals are given to the same configurations, and description thereof may not be repeated.

An oscillator 1A of the second embodiment shown in FIGS. 10 and 11 is the same as the oscillator 1 of the above-described first embodiment except that a position of a connection portion with respect to a circuit board 8A of a lead terminal 121 that supports (suspends) a resonator module 2 accommodated in an accommodation space (cavity) S1 is changed. Hereinafter, the lead terminal 121 and the circuit board 8A that are different configurations will be mainly described.

The oscillator 1A of this embodiment includes a case 10 that includes a base 101 and a cap 102 joined to the base 101, a base substrate 30 that is a second substrate provided on a side of a lower surface 101r of the base 101, and a regulator 40 mounted on an upper surface 30f of the base substrate 30, as shown in FIG. 10. The case 10 has an accommodation space (cavity) S1 that is formed by the base 101 and the cap 102 that is provided along an outer periphery of the base 101 and is joined to an upper surface (a surface on the +Z-axis side) of a flange 101b that is recessed from an upper surface 101f of the base 101. Since these components are the same as in the first embodiment, description thereof will not be repeated.

In the accommodation space S1 in the case 10, a plurality of pin terminals 14 that are air-tightly sealed by a sealing member 103 and pass through the base 101, which are hermetic terminals, a circuit board 8A that is a first substrate fixed to end portions of the pin terminals 14 on a side opposite to the base 101, and a resonator module 2 that is supported with a gap with respect to the circuit board 8A between the circuit board 8A and the base 101 through the plurality of lead terminals 121 connected to the circuit board 8A, are accommodated. Further, a heater 7 is connected, on a side of the base 101, to the resonator module 2 disposed in the accommodation space S1, and an oscillation circuit element 4 that includes an oscillation circuit of the resonator module 2 is connected, on a side of the resonator module 2, to the circuit board 8A. In other words, the respective components, that is, the heater 7 connected to the resonator module 2, the resonator module 2 connected to the circuit board 8A through the lead terminals 121, the oscillation circuit element 4 connected to the circuit board 8A, and the circuit board 8A are sequentially disposed in the accommodation space S1, from the side of the base 101, in a plan view in the Y-axial direction. Here, as described above, since the components other than the lead terminal 121 and the circuit board 8A, for example, the resonator module 2, the oscillation circuit element 4, and the like are the same as in the first embodiment, description thereof will not be repeated.

The circuit board 8A that is the first substrate may be configured of a printed circuit board (PCB), for example. The circuit board 8A is formed in a rectangular shape in a plan view seen in the Z-axial direction, and is formed with through holes at positions that face positions where the pin terminals 14 fixed to the base 101 are erected. In addition, the circuit board 8A is fixed to the pin terminals 14 in a state where the ends of the pin terminals 14 on the side of the accommodation space S1 are inserted in the through holes. The circuit board 8A includes a lower surface 108r that is a first surface that is a surface on the side of the base 101, and an upper surface 108f that is a second surface that is a surface opposite to the lower surface 108r. Further, the circuit board 8A is configured so that a cut portion 109 is provided on an outer peripheral side of a connection region R2 in which each lead terminal 121 that supports the resonator module 2 is connected. In the cut portion 109, the lead terminal 121 penetrates and extends from the side of the lower surface 108r toward the side of the upper surface 108f.

On the upper surface 108f that is the second surface of the circuit board 8A and the lower surface 108r that is the first surface thereof, circuit patterns of circuit interconnects, terminals, and the like (not shown) are provided. Further, for example, a digital to analog (D/A) conversion element 5, a temperature sensor 15, a different electronic element 16, and the like are connected to the circuit pattern on the upper surface 108f of the circuit board 8A.

Further, the plurality of lead terminals 121 that support the resonator module 2 and the oscillation circuit element 4 that includes an oscillation circuit of the resonator module 2 are connected to the circuit pattern of the upper surface 108f on the circuit board 8A. The lead terminals 121 are connected in the connection regions R2 that are positioned inside the cut portion 109 on outer peripheral sides of the circuit board 8A and are respectively arranged along two rows in which the pin terminals 14 are connected using connecting materials 110 such as soldering or a conductive adhesive.

A second connection portion 12a of the lead terminal 121 is electrically connected and fixed to each of the first connection terminals 24 and the second connection terminals 26 that are provided on the lower surface 21r of the resonator module 2, for example, using a conductive adhesive, soldering, or the like. The resonator module 2 is supported in a so-called suspended state on the circuit board 8A through the lead terminals 121 in a state where first connection portions 12d of the lead terminals 121 are electrically connected and fixed to the upper surface 108f of the circuit board 8A.

Each lead terminal 121 includes the second connection portion 12a provided at a position that includes one end thereof, the first connection portion 12d provided at a position that includes the other end thereof, and a first extension portion 12b and a second extension portion 12c that are positioned between the second connection portion 12a and the first connection portion 12d and are connected to each other at a second bending portion B2. Further, the second connection portion 12a and the first extension portion 12b are connected to each other at a first bending portion B1, and the first connection portion 12d and the second extension portion 12c are connected to each other at a third bending portion B3. In other words, the lead terminal 121 includes three bending portions of the first bending portion B1, the second bending portion B2, and the third bending portion B3 between the second connection portion 12a connected to the resonator module 2 and the first connection portion 12d.

Further, more specifically, each lead terminal 121 includes the second connection portion 12a provided at the position including one end thereof, the first extension portion 12b that extends from the second connection portion 12a and is bent in a direction of being gradually spaced from the resonator module 2 at the bending portion B1, the second extension portion 12c that extends from the first extension portion 12b and is bent in a direction of being gradually close to the resonator module 2 at the second bending portion B2, and the first connection portion 12d that extends from the second extension portion 12c and is bent that is approximately parallel to the lower surface 21r of the package base 21 at the third bending portion B3. In other words, the lead terminal 121 has a configuration in which the second connection portion 12a is connected to the first connection terminal 24 and the second connection terminal 26 of the resonator module 2 and the first connection portion 12d is connected to the upper surface 108f of the circuit board 8A while passing inside the cut portion 109 of the circuit board 8A while protruding at the second bending portion B2 in an outward direction with a gap with respect to an outer surface of the resonator module 2.

As described above, as the three bending portions of the first bending portion B1, the second bending portion B2, and the third bending portion B3 are provided in the lead terminal 121 between the second connection portion 12a connected to the resonator module 2 and the first connection portion 12d connected to the circuit board 8A and the resonator module 2 is supported in a so-called suspended state with respect to the circuit board 8A, it is possible to easily cause the lead terminal 121 to be deflected. Further, since the lead terminal 121 is configured to protrude at the second bending portion B2 in the outward direction of the resonator module 2, it is possible to weaken stiffness of the lead terminal 121, and to effectively absorb shock or the like transmitted to the resonator module 2 from the circuit board 8A.

In addition, since the lead terminal 121 is connected to the upper surface 108f of the circuit board on a side opposite to the base 101, it is possible to prevent the lead terminal from being detached from the circuit board 8A toward the base 101.

Further, since the lead terminal 121 is disposed to pass through the cut portion 109 of the circuit board 8A, it is possible to easily perform positioning of the lead terminal 121 using a side surface of the cut portion 109 as a guide. In addition, it is possible to easily view a connection portion between the circuit board 8A and the lead terminal 121, and to easily confirm joining, in a plan view in the +Z-axial direction.

Furthermore, it is preferable that the lead terminal 121 is configured so that the first connection portion 12d of the lead terminal 121 connected to the circuit board 8A, in a plan view in a direction where the resonator module 2 and the circuit board 8A are arranged, that is, in the −Z-axial direction is disposed outside with reference to a contour of the resonator module 2. In this way, as the first connection portion 12d of the lead terminal 121 connected to the circuit board 8A is disposed outside with reference to the contour of the resonator module 2, in the plan view, it is possible to easily view the first connection portion 12d of the lead terminal 121, and to easily confirm a connection state, from the side of the resonator module 2 (in the −Z-axial direction).

A configuration in which four lead terminals 121 are disposed on the side of the first connection terminals 24 of the resonator module 2 and four lead terminals 121 are disposed on the side of the second connection terminals 26 is shown, but the number of the lead terminals 121 is not limited thereto. Any number of lead terminals 121 that is able to support the resonator module 2 may be used.

According to the oscillator 1A of to the second embodiment, it is possible to obtain the same effects as those of the oscillator 1 in the first embodiment. In addition, since the lead terminal 121 is connected to the upper surface 108f of the circuit board on the side opposite to the base 101, it is possible to prevent the lead terminal from being detached from the circuit board 8A toward the base 101. Furthermore, since the lead terminal 121 is provided to pass through the cut portion 109 of the circuit board 8A, it is possible to easily perform positioning of the lead terminal 121 using a side surface of the cut portion 109.

In the above-described circuit board 8A, a configuration in which the cut portions 109 are provided and the lead terminals 121 are disposed to pass through the cut portions 109 of the circuit board 8A is shown, but a configuration in which the cut portions 109 are not provided may be used. In this case, the lead terminal 121 may pass through an outer side of the outer periphery of the circuit board, and may be positioned using the outer peripheral side surface of the circuit board as a guide.

Third Embodiment

Figure 12:
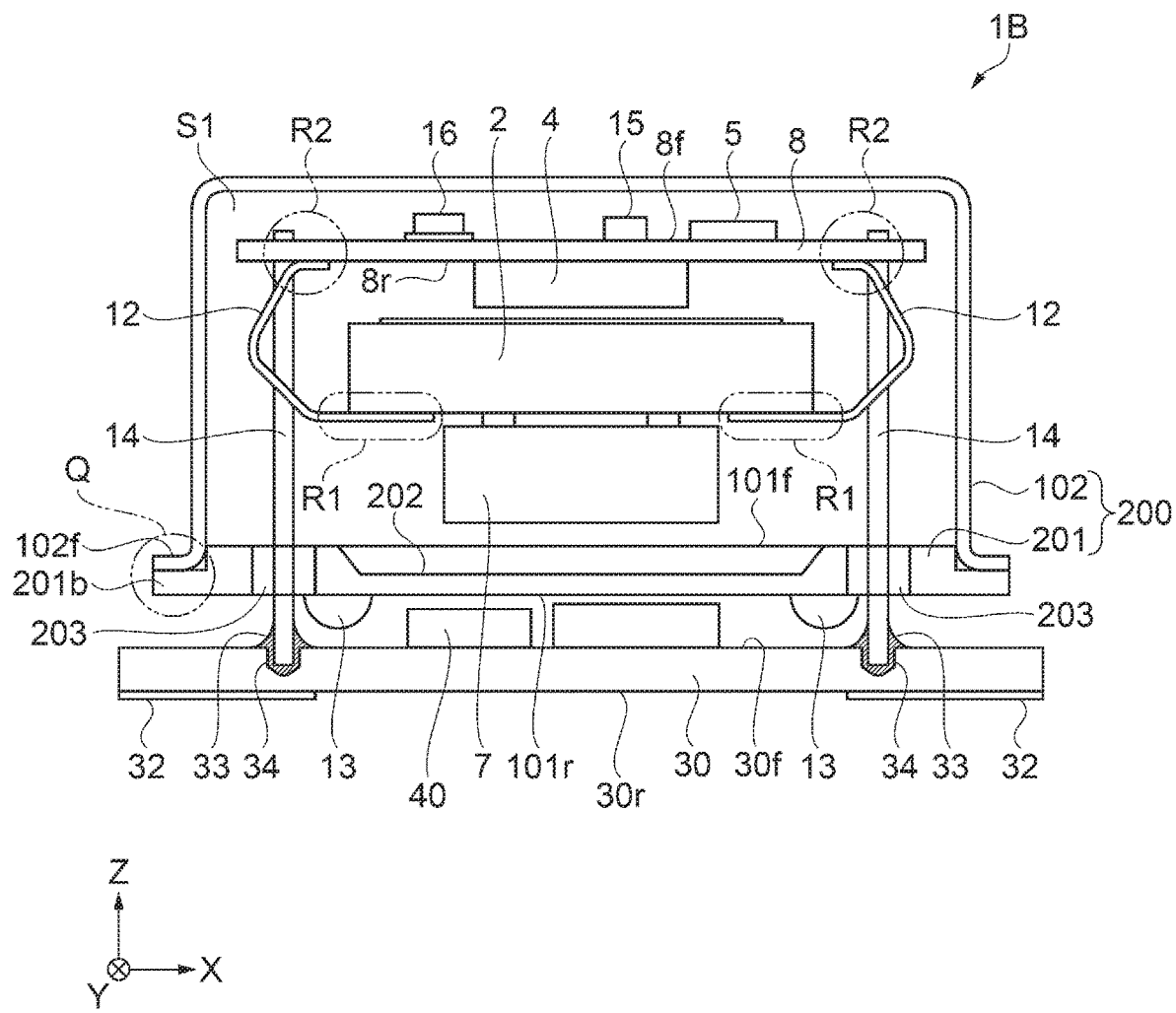
FIG. 12 is a sectional view of an oscillator according to a third embodiment.

Next, an oscillator according to a third embodiment will be described with reference to FIG. 12. FIG. 12 is a sectional view of the oscillator according to the third embodiment. In the following description according to the third embodiment, configurations different from those of the first embodiment will be mainly described. Further, in the respective drawings, the same reference numerals are given to the same configurations, and description thereof may not be repeated.

An oscillator 1B according to the third embodiment shown in FIG. 12 is the same as the oscillator 1 according to the first embodiment except that a configuration of a case 200 including a base 201 is changed. Hereinafter, the case 200 including the base 201 that is a different configuration will be mainly described.

As shown in FIG. 12, the oscillator 1B according to this embodiment includes the case 200 that includes the base 201 and a cap 102 joined to the base 201, a base substrate 30 that is a second substrate provided on a side of a lower surface 101r of the base 201, and a regulator 40 mounted on an upper surface 30f of the base substrate 30. The case 200 has an accommodation space (cavity) S1 that is formed by the base 201 and the cap 102 that is provided along an outer periphery of the base 201 and is joined to an upper surface (a surface on the +Z-axis side) of a flange 201b that is recessed from an upper surface 101f of the base 201. Since the components other than the case 200 including the base 201 are the same as in the first embodiment, description thereof will not be repeated.

In the accommodation space S1 in the case 200, a plurality of pin terminals 14 that are air-tightly sealed by a sealing member 203 and pass through the base 201, which are hermetic terminals, a circuit board 8 that is a first substrate fixed to end portions of the pin terminals 14 on a side opposite to the base 201, and a resonator module 2 that is supported with a gap with respect to the circuit board 8 between the circuit board 8 and the base 201 through a plurality of lead terminals 12 connected to the circuit board 8, are accommodated. Further, a heater 7 is connected, on a side of the base 201, to the resonator module 2 disposed in the accommodation space S1, and an oscillation circuit element 4 that includes an oscillation circuit of the resonator module 2 is connected, on a side of the resonator module 2, to the circuit board 8. In other words, the respective components, that is, the heater 7 connected to the resonator module 2, the resonator module 2 connected to the circuit board 8 through the lead terminals 12, the oscillation circuit element 4 connected to the circuit board 8, and the circuit board 8 are sequentially disposed in the accommodation space S1, from the side of the base 201, in a sectional view in the Y-axial direction. Here, since these components, for example, the resonator module 2, the oscillation circuit element 4, and the like are the same as in the first embodiment, description thereof will not be repeated.

The base 201 that forms the case 200 is formed of a material such as Kovar, soft iron, or iron nickel, for example, and is provided with the flange 201b in the outer peripheral portion. Further, in the base 201, a plurality of through holes that penetrate from an upper surface 101f to a lower surface 101r are provided, and the conductive pin terminal 14 is inserted into each through hole. Each pin terminal 14 is formed of a hermetic terminal, for example, and a gap between the through hole and the pin terminal 14 is air-tightly sealed by the sealing member 203 such as glass. Further, stand-offs 13 formed of an insulator such as glass may be provided on the lower surface 101r of the base 201.

Further, on the base 201, a recess 202 that is recessed from the upper surface 101f is provided in a central portion of the upper surface 101f that is a surface on the resonator module 2. By providing the recess 202 on the upper surface 101f that is the surface of the base 201 on the side of the resonator module 2, it is possible to accommodate other components in the recess 202, and to enhance efficiency of disposition of the components in the accommodation space S1.

Further, the cap 102 that forms the case 200 is provided by forming a thin plate of a metallic material such as nickel silver, Kovar, soft iron or iron nickel through pressing, raising, or the like in a recessed shape, and includes an outer peripheral portion 102f formed by bending outward an opening portion thereof in a flange shape.

Further, as described above, the case 200 has a configuration in which the accommodation space (cavity) S1 is formed by mounting the outer peripheral portion 102f of the cap 102 to overlap the flange 201b of the base 201 and air-tightly joining (air-tightly sealing) a portion Q in which the flange 201b and the outer peripheral portion 102f overlap each other using, for example, a resistance welding process, or the like. The accommodation space S1 is air-tightly sealed to have a reduced pressure atmosphere of a pressure lower than the atmospheric pressure (which may be referred to as vacuum), or an inert gas atmosphere of nitrogen, argon, or helium.

According to the oscillator 1B of the third embodiment, it is possible to obtain the same effects as those of the oscillator 1 in the first embodiment. In addition, it is possible to secure a room in the space between the base 201 and the circuit board 8 by providing the recess 202 on the upper surface 101f that is the surface of the base 201 on the side of the resonator module 2, and it is possible to accommodate other components in the recess 202. Thus, it is possible to obtain the freedom of design for enhancement of performance.

Fourth Embodiment

Figure 13:
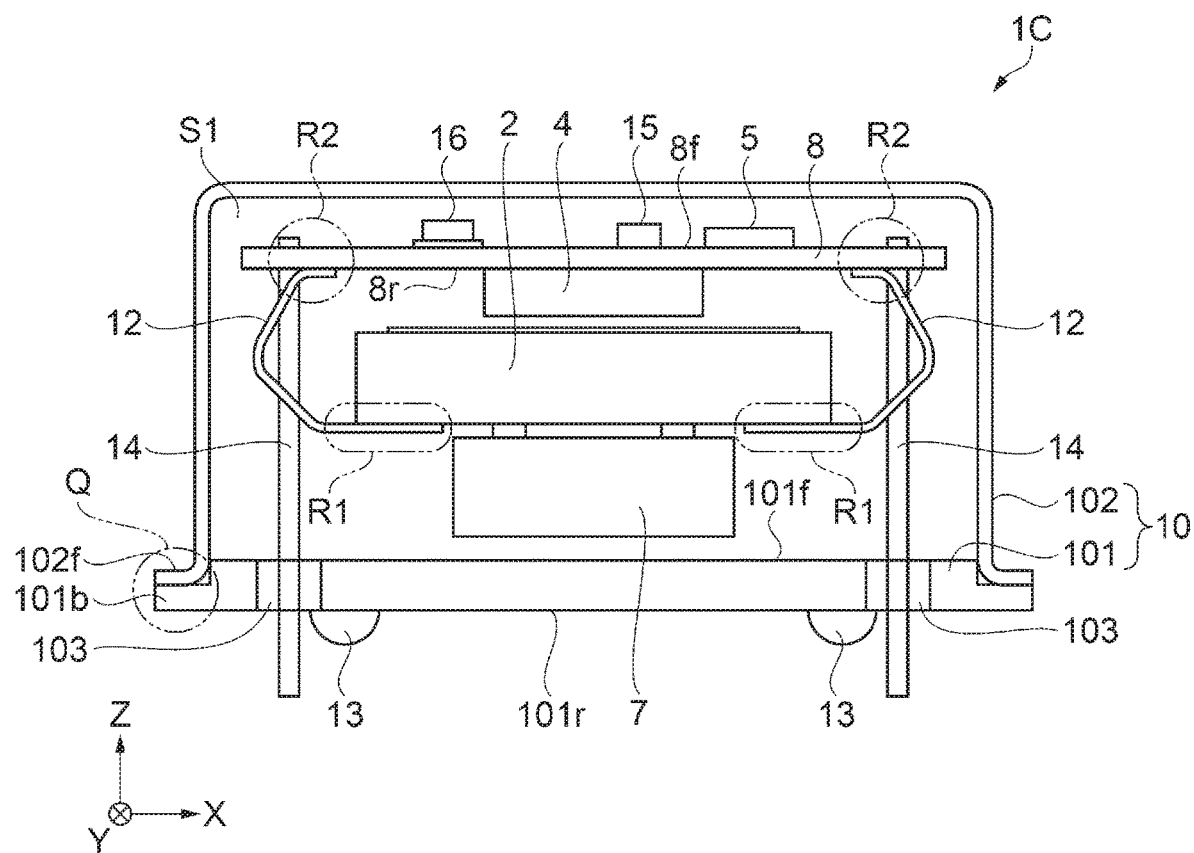
FIG. 13 is a sectional view of an oscillator according to a fourth embodiment.

Next, an oscillator according to a fourth embodiment will be described with reference to FIG. 13. FIG. 13 is a sectional view of the oscillator according to the fourth embodiment. In the following description according to the fourth embodiment, configurations different from those of the first embodiment will be mainly described. Further, in the respective drawings, the same reference numerals are given to the same configurations, and description thereof will not be repeated.

An oscillator 1C according to the fourth embodiment shown in FIG. 13 has a configuration in which the base substrate 30 that is the second substrate provided on the side of the lower surface 101r of the base 101 that forms the oscillator 1 according to the first embodiment is removed. A configuration of a case 10 and components accommodated in an accommodation space S1 of the case 10 are the same as in the oscillator 1 of the first embodiment. Hereinafter, description of the same configurations as in the oscillator 1 of the first embodiment will not be repeated.

As shown in FIG. 13, the oscillator 1C according to this embodiment includes the case 10 that includes the base 101 and a cap 102 joined to the base 101. The case 10 has the accommodation space (cavity) S1 that is formed by the base 101 and the cap 102 that is provided along an outer periphery of the base 101 and is joined to an upper surface (a surface on the +Z-axis side) of a flange 101b that is recessed from an upper surface 101f of the base 101.

In the accommodation space S1 in the case 10, a plurality of pin terminals 14 that are air-tightly sealed by a sealing member 103 and pass through the base 101, which are hermetic terminals, a circuit board 8 that is a first substrate fixed to end portions of the pin terminals 14 on a side opposite to the base 101, and a resonator module 2 that is supported with a gap with respect to the circuit board 8 between the circuit board 8 and the base 101 through the plurality of lead terminals 12 connected to the circuit board 8, are accommodated. Further, a heater 7 is connected, on a side of the base 101, to the resonator module 2 disposed in the accommodation space S1, and an oscillation circuit element 4 that includes an oscillation circuit of the resonator module 2 is connected, on a side of the resonator module 2, to the circuit board 8. In other words, the respective components, that is, the heater 7 connected to the resonator module 2, the resonator module 2 connected to the circuit board 8 through the lead terminals 12, the oscillation circuit element 4 connected to the circuit board 8, and the circuit board 8 are sequentially disposed in the accommodation space S1, from the side of the base 101, in a sectional view in the Y-axis direction. In the accommodation space S1, a regulator (not shown) that adjusts a power supply voltage of the heater 7 may be disposed.

According to the oscillator 1C of the fourth embodiment, it is possible to obtain the same effects as those of the oscillator 1 of the first embodiment. In addition, using stand-offs 13 formed of an insulator provided on the lower surface 101r of the base 101 as a support portion, the pin terminals 14 may be inserted and mounted in a printed circuit board such as an electronic device, for example.

Electronic Device

Figure 14:
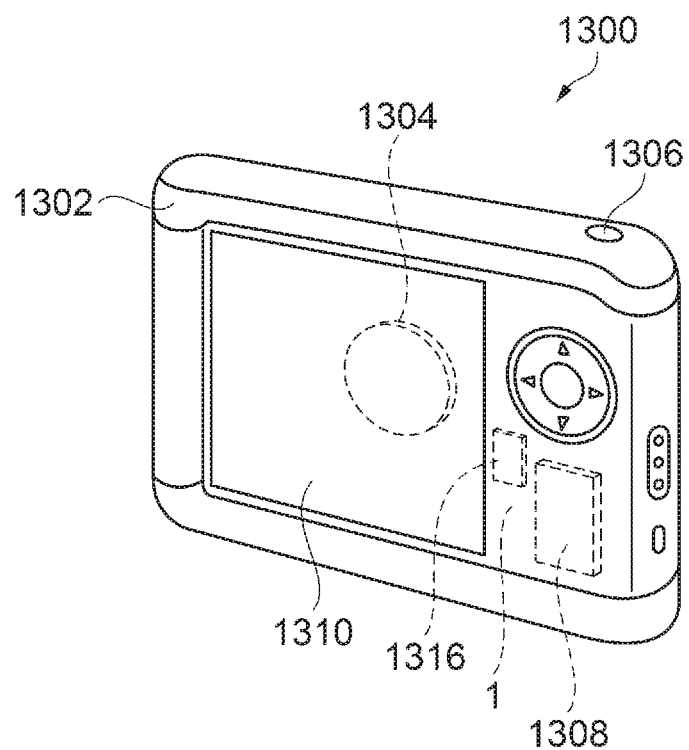
FIG. 14 is a perspective view showing a digital still camera that is an electronic device.

Next, with respect to an electronic device provided with the oscillator 1, 1A, 1B, or 1C according to the above-described embodiments, a digital still camera shown in FIG. 14 will be described as an example. FIG. 14 is a perspective view showing a digital still camera that is an electronic device according to the invention. In the following description, an example using the oscillator 1 will be described.

As shown in FIG. 14, a display 1310 is provided on a rear surface of a case (body) 1302 in a digital still camera 1300, and is configured to perform display based on an imaging signal of a CCD. The display 1310 functions as a finder that displays a subject as an electronic image. Further, on a front surface side (in the figure, a rear surface side) of the case 1302, a light receiving unit 1304 that includes an optical lens (imaging optical system), a CCD, and the like is provided. Further, in a case where a user confirms a subject image displayed on the display 1310 and presses a shutter button 1306, an imaging signal of the CCD at that time point is transmitted to a memory 1308 for storage. In such a digital still camera 1300, an oscillator 1 is provided therein, and a controller 1316 is able to perform various controls relating to the digital still camera 1300 based on a highly accurate timing signal output from the oscillator 1.

Since the digital still camera 1300 that is such an electronic device has the oscillator 1, it is possible to show the above-described effects of the oscillator 1, and to achieve excellent reliability, particularly, an excellent temperature characteristic.

The electronic device according to the invention may be applied, in addition to the digital still camera 1300 shown in FIG. 14, to an electronic device such as a personal computer, a portable phone, a smartphone, a tablet terminal, a timepiece (including Smart Watch), an ink jet type discharge device (for example, an ink jet printer), a lap-top personal computer, a TV, a wearable terminal such as a head mounted display (HMD), a video camera, a video tape recorder, a car navigation device, a pager, an electronic organizer (including a communication function), an electronic dictionary, an electronic calculator, an electronic game machine, a word processor, a workstation, a TV phone, a crime prevention TV monitor, electronic binoculars, a POS terminal, medical equipment (for example, an electronic clinical thermometer, a blood manometer, a blood glucose monitoring system, an electrocardiogram measuring device, an ultrasonic diagnostic device, or an electronic endoscope), a fish finder, a variety of measuring devices, a device for a moving object terminal base station, meters (for example, meters of a vehicle, an aircraft, or a ship), a flight simulator, a network server, a head mounted display, a motion tracing device, a motion tracking device, a motion controller, or a pedestrian dead reckoning (PDR) device. In a case where the above-described oscillator 1, 1A, 1B, or 1C is used, a thermostatic state is maintained, which is suitable for an electronic device used under a condition of a strict temperature environment, such as a communication base station.

Further, the oscillator 1, 1A, 1B, or 1C according to the invention may be applied to a moving object. In the following description, an example in which the oscillator 1 is used will be described. Hereinafter, a case in which the oscillator 1 according to the invention is applied to an automobile that is an example of a moving object will be described as an example.

An electronic control unit (ECU) that controls a posture of a vehicle body or an output of an engine, in which the oscillator 1 is mounted, is mounted in an automobile. In addition, the oscillator 1 may be widely applied to a vehicle body posture control unit, an anti-locking brake system (ABS), an air back, or a tire pressure monitoring system (TPMS).

Further, the posture control unit with the oscillator 1 built therein may be used in a robotic system such as a bipedal walking robot, a radio-controlled helicopter, or the like, as another vehicle. Since such a moving object uses the oscillator 1 in which a thermostatic state is maintained, even in a case of being used under a condition of a strict temperature environment, it is possible to achieve high reliability.

In the above-described embodiments, a configuration in which the quartz-crystal resonator element 3 is used as an oscillation element has been described, but the oscillation element is not limited to the quartz-crystal resonator element 3, and for example, may employ an oxide substrate of aluminum nitride (AlN), lithium niobate ($LiNbO_3$), lithium tantalate ($LiTaO_3$), lead zirconate titanate (PZT), lithium tetraborate ($Li_2B_4O_7$), langasite crystal ($La_3Ga_5SiO_{14}$), potassium niobate ($KNbO_3$), gallium phosphate ($GaPO_4$), gallium arsenide (GaAs), zinc oxide (ZnO, $Zn_2O_3$), barium titanate ($BaTiO_3$), lead titanate ($PbPO_3$), sodium potassium niobate ((K, Na) $NbO_3$), bismuth ferrite ($BiFeO_3$), sodium niobate ($NaNbO_3$), bismuth titanate ($Bi_4Ti_3O_{12}$), bismuth sodium titanate ($Na_{0.5}Bi_{0.5}TiO_3$), or the like, a laminated piezoelectric substrate formed by laminating a piezoelectric material such as aluminum nitride or tantalum pentoxide ($Ta_2O_5$) on a glass substrate, or a piezoelectric resonator element using piezoelectric ceramics or the like. Further, the oscillation element may employ a resonator element formed by disposing a piezoelectric element on a silicon substrate. In addition, the quartz-crystal resonator element is not limited to an SC cut resonator element, and for example, may employ a resonator element of an AT cut, a BT cut, a Z cut, an LT cut, or the like.

The above-described embodiments are only examples, and the invention is not limited thereto. For example, respective embodiments, respective application examples, and respective modification examples may be appropriately combined.

The invention includes configurations that are substantially the same as the configurations described in the embodiments (for example, configurations having the same functions, methods, and results, or configurations having the same objects and effects). Further, the invention includes configurations in which portions that are not essential in the configurations described in the embodiments are replaced. In addition, the invention includes configurations having the same effects or configurations having the same object as in the configurations described in the embodiments. Furthermore, the invention includes configurations in which a known technique is added to the configurations described in the embodiments.

The entire disclosure of Japanese Patent Application No. 2017-127046, filed Jun. 29, 2017 is expressly incorporated by reference herein.

What is claimed is:

1. An oscillator comprising:
   a case that has a base and a cap connected to the base;
   a first substrate accommodated in the case;
   a lead terminal electrically connected to the first substrate; and
   a resonator module electrically connected to the lead terminal, and supported by the lead terminal with a gap with respect to the first substrate between the first substrate and the base,
   wherein a heater is disposed on a surface of the resonator module on a side of the base.

2. The oscillator according to claim 1,
   wherein the base and the cap are air-tightly sealed.

3. The oscillator according to claim 1,
   wherein the first substrate has a first surface disposed on the side of the base and a second surface opposite to the first surface, and
   wherein the lead terminal is connected to the first surface.

4. The oscillator according to claim 1,
   wherein the first substrate has a first surface disposed on the side of the base and a second surface opposite to the first surface, and
   wherein the lead terminal is connected to the second surface.

5. The oscillator according to claim 1,
   wherein at least a part of an oscillation circuit element is disposed between the resonator module and the first substrate.

6. The oscillator according to claim 1,
   wherein in a plan view in a direction where the base, the resonator module, and the first substrate are arranged, a first connection portion of the lead terminal connected to the first substrate is positioned outside with reference to a contour of the resonator module.

7. The oscillator according to claim 6,
   wherein the lead terminal has three bending portions between a second connection portion connected to the resonator module and the first connection portion.

8. The oscillator according to claim 1,
   wherein the base has a recess on a surface thereof on the side of the resonator module.

9. The oscillator according to claim 1, further comprising:
   a second substrate that is disposed on a side of the base opposite to the resonator module,
   wherein a regulator that adjusts a power supply voltage of the heater is connected to the second substrate.

10. An electronic device comprising:
    an oscillator comprising:
       a case having a base and a cap that is connected to the base to form an accommodation space between the cap and the base;
       a first substrate that is accommodated in the accommodation space;
       a lead terminal that is electrically connected to the first substrate; and
       a resonator module that is electrically connected to the lead terminal and is supported by the lead terminal with a gap with respect to the base,
       wherein a heater is disposed on a surface of the resonator module on a side of the base; and
    a controller configured to perform control based on a signal of the oscillator.

11. An oscillator comprising:
    a case that has a base and a cap connected to the base;
    a first substrate accommodated in the case, the first substrate having a first surface disposed on a side of the base and a second surface opposite to the first surface;
    a lead terminal electrically connected to the second surface of the first substrate; and
    a resonator module electrically connected to the lead terminal, and supported by the lead terminal with a gap with respect to the first substrate between the first substrate and the base.

* * * * *